(12) United States Patent
Fukaya et al.

(10) Patent No.: US 8,013,271 B2
(45) Date of Patent: Sep. 6, 2011

(54) SOLDERING METHOD AND APPARATUS

(75) Inventors: Hiroshi Fukaya, Shatin (CN); Satoshi Yamaguchi, Shatin (CN)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 787 days.

(21) Appl. No.: 12/021,586

(22) Filed: Jan. 29, 2008

(65) Prior Publication Data
US 2008/0237313 A1    Oct. 2, 2008

(30) Foreign Application Priority Data

Jan. 30, 2007  (JP) ................................. 2007-020141

(51) Int. Cl.
*B23K 26/20* (2006.01)
*G11B 5/127* (2006.01)

(52) U.S. Cl. .............. 219/121.65; 219/121.66; 228/232; 29/603.06

(58) Field of Classification Search ............. 219/121.11, 219/121.6, 121.63, 121.64, 121.65, 121.66; 29/603.06; 228/51, 230, 232
See application file for complete search history.

(56) References Cited

U.S. PATENT DOCUMENTS

| | | | | |
|---|---|---|---|---|
| 3,528,867 A | * | 9/1970 | Heller, Jr. et al. | 156/272.4 |
| 5,201,458 A | * | 4/1993 | Hagen | 228/199 |
| 5,289,966 A | * | 3/1994 | Izumi et al. | 228/180.21 |
| 5,781,380 A | * | 7/1998 | Berding et al. | 360/264.2 |
| 6,543,677 B2 | * | 4/2003 | Pattanaik et al. | 228/246 |
| 7,164,097 B2 | * | 1/2007 | Shindo et al. | 219/121.64 |
| 2002/0110335 A1 | * | 8/2002 | Wagner et al. | 385/89 |
| 2005/0195527 A1 | * | 9/2005 | Yamaguchi | 360/234.5 |
| 2006/0108400 A1 | | 5/2006 | Fukaya et al. | |
| 2006/0188825 A1 | * | 8/2006 | Kang et al. | 430/322 |
| 2007/0102485 A1 | | 5/2007 | Fukaya et al. | |

FOREIGN PATENT DOCUMENTS

| | | | |
|---|---|---|---|
| JP | 362292266 A | * | 12/1987 |
| JP | 403221262 A | * | 9/1991 |
| JP | 405226386 A | * | 9/1993 |
| JP | 2004-260019 | | 9/2004 |
| JP | 2005-123581 | | 5/2005 |

OTHER PUBLICATIONS

U.S. Appl. No. 12/021,558 to Fukaya et al, filed Jan. 29, 2008.
English language Abstract of JP 2004-260019.
English language Abstract of JP 2005-123581.

* cited by examiner

*Primary Examiner* — Samuel M Heinrich
(74) *Attorney, Agent, or Firm* — Greenblum & Bernstein P.L.C.

(57) ABSTRACT

To improve the quality of the products that are manufactured by soldering, through enabling highly reliable soldering while suppressing damages to the bonding targets caused due to the soldering. Provided is a soldering method for bonding each of bonding pads formed in respective bonding targets with solder. The method comprises: a bonding target placing step for placing each of bonding targets to a bonding position; a soldering step for placing solder between each of the bonding pads formed in each of the bonding targets, and for performing soldering by irradiating a heating beam to the solder; and a bonding target heating step for heating at least one of the bonding targets, which is executed before the soldering step and/or simultaneously with the soldering step.

13 Claims, 22 Drawing Sheets

PRIOR ART

PRIOR ART

PRIOR ART

PRIOR ART

PRIOR ART

FIG. 6A

| PAD No. | Pre-bumping (mJ) |
|---|---|
| 1 | 10.9 |
| 2 | 11.7 |
| 3 | 11.2 |
| 4 | 11.5 |
| 5 | 11.2 |
| 6 | 10.4 |

PRIOR ART

FIG. 6B

| PAD No. | Reflow (mJ) |
|---|---|
| 1 | 32.7 |
| 2 | 37.6 |
| 3 | 38.8 |
| 4 | 35.9 |
| 5 | 35 |
| 6 | 34.7 |

PRIOR ART

FIG. 16

| PAD No. | Reflow(mJ) |
|---|---|
| 1 | 15.6 |
| 2 | 19 |
| 3 | 19 |
| 4 | 18.4 |
| 5 | 15.8 |
| 6 | 14.4 |

SOLDERING METHOD AND APPARATUS

BACKGROUND OF THE INVENTION

1. Field of the Invention

The present invention relates to a method and an apparatus for soldering and, more specifically, to a method and an apparatus for soldering electronic components to a substrate.

2. Description of the Related Art

Soldering is employed in many cases as a method for bonding electronic components to substrates. By employing soldering, it is possible to fix an electronic component to a substrate and to electrically connect a terminal formed in the electronic component with a terminal formed on the substrate at the same time. For example, as will be described later, it can be employed for soldering a magnetic head slider (an electronic component) to a suspension (flexure) to which a flexible printed board is unified, when manufacturing a head gimbals assembly that is loaded on a magnetic disk device.

However, when the bonding target by executing soldering is an electronic component as in the case described above, the electronic component may be increased to a high temperature of more than its heat resistant property due to the heat applied at the time of soldering. This may cause such a problem that the heat of the soldering damages the electronic component. Therefore, conventionally, heating of solder by a laser or the like is limited to a short time. Further, as in Patent Document 1 mentioned below, there is also a method disclosed in which heat released from the main body of the electronic component as a bonding target is measured at the time of soldering, and the heating action is controlled so that the electronic component is soldered at a temperature lower than its heat resistant property. In the meantime, when the heating time for soldering is limited to a short time, fusion of solder becomes insufficient because the heating time is not long enough. Thus, stable soldering cannot be achieved.

Further, when soldering two bonding targets, e.g. when soldering an electronic component to a substrate, a temperature increase rate of each bonding pad of each bonding target may become different depending on the structures of the respective bonding targets, soldering conditions, and the like. In that case, if the temperature increase rates of those bonding pads are different by a great extent, one of the bonding targets remains to be in a low temperature. Therefore, soldering cannot be performed securely. In the meantime, when too much heat is applied to the solder for achieving secure soldering, the temperature of the other bonding target may be excessively increased. This may cause damages to the other bonding target by the heat. An example of such case will be described by referring to a case of soldering a magnetic head slider to a suspension (flexible printed board) of a head gimbals assembly that is loaded on a disk device, by referring to FIG. 1A to FIG. 6B.

For soldering a magnetic head slider, first, as shown in FIG. 1A, a magnetic head slider 102 having a magnetic head element 121 is sucked and held to a transporting nozzle 104, and the transporting nozzle is moved in a direction shown by an arrow Y101 so as to place the magnetic head slider 102 at a bonding point on a flexible printed board 113 that is unified on a flexure 112. At this time, as shown in FIG. 1B, for example, the magnetic head slider 102 is placed in such a manner that a slider-side pad 122 formed in the magnetic head element 121 of the magnetic head slider 102 comes close to a suspension-side pad 114 formed on the flexible printed board 113.

Thereafter, as shown with an arrow Y102 of FIG. 1A, a laser irradiating nozzle 106 having a solder ball 103 sucked and held at its tip is moved so that the solder ball 103 is abutted against the slider-side pad 122 and the suspension-side pad 114, which are to be solder-bonded. Under this state, laser beam L101 is irradiated to the solder ball 103 from the laser irradiating nozzle 106.

Upon this, the solder ball 103 to which the laser beam L101 is irradiated is fused and supposed to bond each pad. However, it is sometimes difficult to apply heat uniformly to the each of the bonding pads 122 and 114, i.e. the magnetic head slider side and the suspension side. Particularly, in this example of soldering, the magnetic head slider 102 is sucked or in contact with the transporting nozzle 104. Thus, as shown with the arrows of FIG. 2A, the heat applied by the laser beam L101 from the laser irradiating nozzle 106 and transmitted to the slider-side pad 122 is absorbed by the magnetic head slider 102 and the transporting nozzle 104. Therefore, the temperature of the slider-side pad 122 becomes lower than the temperature of the suspension-side pad 114 at the time of soldering, so that it becomes difficult to have the solder bonded to the slider-side pad 122. As shown in FIG. 2B, this results in having poor soldering, such as having the solder 103 remained only on the suspension-side pad 114.

In the meantime, when the laser beam L101 with a high energy is irradiated from the laser irradiating nozzle 106 (see FIG. 3A) in order to avoid the poor soldering described above, an excessive amount of heat may be applied to the suspension-side pad 114, even though it allows the low-temperature slider-side pad 122 to be heated to a proper temperature for achieving the soldering. If so, as shown in FIG. 3B, there is a possibility of having a damage D by the heat generated in a structure near the suspension-side pad 114, such as on a polyimide layer that forms the flexible printed board.

FIG. 4A to FIG. 5B are photographs of a head gimbals assembly to which soldering is actually performed. FIG. 4A and FIG. 4B show a state (pre-bumping) where: the magnetic head slider 102 is placed on the suspension 112; the solder ball 103 is set between each of the bonding pads 122 and 114 to be bonded; and the solder ball 103 is heated at that bonding point to be tentatively fixed so that a part of the solder ball 103 is being fused. Further, FIG. 5A and FIG. 5B show a state (reflow) where the solder 103 is completely fused for securely bonding each of the bonding pads 122 and 114. FIG. 4A and FIG. 5A are photographs of the head gimbals assembly viewed from the magnetic head slider 102 side, and FIG. 4B and FIG. 5B are photographs viewed from the back face side (the polyimide layer 113 side of the flexible printed board). The numbers applied in the photographs indicate the positions of the respective bonding pads 122 and 114. That is, in this case, there are six soldering points. Further, FIG. 6A shows energies of the laser applied to each solder ball 103 (each bonding pad) at the time of pre-bumping shown in FIG. 4A and FIG. 4B, and FIG. 6B shows the energies of the laser applied to each solder ball 103 (each bonding pad) at the time of reflow shown in FIG. 5A and FIG. 5B.

With the soldering method described above, when the solder 103 is fused ad bonded between each of the bonding pads 122 and 114 so as to achieve highly reliable soldering, the damage D by the heat is generated in the structure near the suspension-side pad 114, i.e. on the polyimide layer that forms the flexible printed board, as indicated with a reference code D in FIG. 5B.

Patent Document 1: Japanese Unexamined Patent Publication 2004-260019

SUMMARY OF THE INVENTION

It is an object of the present invention therefore is to improve the inconveniences described above and, in particular, to provide a soldering apparatus and a soldering method which can achieve highly reliable soldering and improve the quality of the products manufactured by the soldering, while suppressing damages imposed on the bonding targets of the soldering.

Therefore, a soldering method according to one aspect of the present invention is a soldering method for bonding each of bonding pads formed in respective bonding targets with solder, which comprises: a step of heating at least one of the bonding targets; and a step of performing soldering by irradiating a heating beam to the solder, after heating the bonding target or while continuing heating of the bonding target.

Further, a soldering method according to another aspect employs a structure which comprises: a bonding target placing step for placing each of bonding targets to a bonding position; a soldering step for placing solder between each of bonding pads formed in each of the bonding targets, and for performing soldering by irradiating a heating beam to the solder; and a bonding target heating step for heating at least one of the bonding targets, which is executed before the soldering step and/or simultaneously with the soldering step.

With the present invention described above, first, each of the bonding targets is placed at the bonding position. Then, solder is placed between each of the bonding pads that are to be soldered, and the heating beam is irradiated to the solder to achieve soldering. At this time, the bonding target is heated before starting the soldering and/or during execution of the soldering. Thus, the soldering can be performed while at least one of the bonding targets itself is in a high temperature. With this, the temperature of the bonding pad becomes boosted up, so that it is possible to achieve highly reliable soldering even if the amount of heat applied to the solder is small. At the same time, excessive heating for the bonding target can be suppressed, thereby making it possible to prevent damages to the bonding target. In addition, the time for soldering can be shortened.

Further, the bonding target heating step heats one of the bonding targets, whose bonding pad has a low temperature increase rate by the heat applied to the solder in the soldering step. With this structure, the bonding target that has a low temperature increase rate by the heat applied at the time of soldering is heated by another device that is different from the solder heating device, when a difference is generated between the temperature increase rates of each bonding pad for the heat generated by the heating laser irradiated to the solder, depending on the structures of the bonding targets and the condition of the soldering. This makes it possible to set the temperature of the bonding pad formed on the bonding target that has a low temperature increase rate to be brought up to a high temperature at the time of soldering. Therefore, it is possible to achieve highly reliable soldering even if the amount of heat applied to the solder is small. At the same time, for the bonding target that has a high temperature increase rate, excessive heating for such bonding target can be suppressed, while enabling highly reliable soldering with a small amount of heat. Therefore, it is possible to prevent damages to the bonding target.

Further, the bonding target heating step applies heat in such a manner that a temperature of the bonding target does not exceed a temperature that is set in advance. With this, the bonding target can be prevented from being excessively heated, which makes it possible to suppress damages to the heated bonding target.

Further, the bonding target heating step heats the bonding target by heating a contact member that is in contact with the bonding target. For example, the contact member is heated by using a heating device that is in contact with the contact member. Alternatively, the contact member is heated by irradiating a heating beam to the contact member. With this, the bonding target can be heated indirectly via the contact member that is in contact with the bonding target, without applying heat directly to the bonding target from a heat source. Therefore, it is possible to suppress abrupt heating of the bonding target, thereby making it possible to suppress damages to the bonding target by such heating.

Furthermore, the bonding target placing step comprises a bonding target transporting step for transporting the bonding target to the bonding position; and the bonding target heating step heats the bonding target while the bonding target is transported in the bonding target transporting step. With this, the bonding target can be heated before starting the soldering so as to increase the temperature of the bonding pad of the bonding target. Therefore, efficiency of the soldering work can be improved, and the time for soldering can be shortened.

The soldering method described above is desirable to be used when manufacturing a head gimbals assembly by bonding a magnetic head slider to a suspension, for example. Specifically, in the above-described bonding target heating step, the magnetic head slider as one of the bonding targets is heated, and the magnetic head slider is bonded to the suspension that is the other bonding target. With this, when the temperature increase rate of the bonding pad of the magnetic head slider by the heat applied to the solder is lower than that of the bonding pad of the suspension, the bonding pad of the magnetic head slider can be heated at the time of soldering to achieve highly reliable soldering. Further, the amount of heat applied at the time of soldering can be suppressed, so that damages to the magnetic head slider as an electronic component and the suspension can be suppressed. As a result, the rate of generating faults in the head gimbals assemblies to be manufactured can be lowered, thereby allowing the manufacture cost to be reduced.

A soldering apparatus as another aspect of the present invention is a soldering apparatus used for bonding each of bonding pads formed in respective bonding targets with solder, which comprises: a solder heating device for performing soldering by irradiating a heating beam to solder placed between each of the bonding pads; and a bonding target heating device for heating at least one of the bonding targets, which is different from the solder heating device.

A soldering apparatus according to still another aspect comprises: a bonding target placing device for placing each of bonding targets to a bonding position; a soldering heating device for performing soldering by irradiating a heating beam to solder that is placed between each bonding pad formed in each of the bonding targets; and a bonding target heating device for heating at least one of the bonding targets, which is different from the solder heating device.

Further, the bonding target heating device heats the bonding target before the solder heating device irradiates the heating beam to the solder and/or while the solder heating device is irradiating the heating beam to the solder. Furthermore, the bonding target heating device comprises a control device which controls heating in such a manner that a temperature of the bonding target does not exceed a temperature that is set in advance.

Moreover, the bonding target heating device heats the bonding target by heating a contact member that is in contact with the bonding target. The bonding target placing device comprises a transporting device for holding and transporting the bonding target to the bonding position, and the bonding target heating device heats the bonding target held to the transporting device through heating the transporting device that is the contact member. Furthermore, the transporting device comprises a suction nozzle which sucks and holds the bonding target at its tip part. For example, the bonding target heating device is a heating device which heats the contact member by being placed in contact with the contact member, or a heating beam irradiating device used for the bonding target, which heats the contact member by irradiating the heating beam to the contact member.

By using the above-described soldering apparatus for bonding the magnetic head slider to the suspension as in the case of the above, high-quality head gimbals assemblies as well as magnetic disks can be manufactured.

The present invention is structured in the manner described above, and it functions accordingly. Thereby, highly reliable soldering can be achieved while suppressing the amount of heat to be applied. Thus, damages to the bonding targets can be prevented by suppressing excessive heat for the bonding targets. Therefore, the quality of the products manufactured by performing soldering can be improved. Furthermore, the present invention can provide such excellent effects that the time for soldering can be shortened and the manufacturing cost can be reduced.

BRIEF DESCRIPTION OF THE DRAWINGS

FIG. 6A shows data of irradiation energies of soldering laser beams irradiated at the time of tentative soldering performed by the soldering method according to the related technique of the present invention;

FIG. 6B shows data of irradiation energies of soldering laser beams irradiated at the time of soldering performed by the soldering method according to the related technique of the present invention;

FIG. 16 shows data of irradiation energies of soldering laser beams according to the present invention;

DETAILED DESCRIPTION OF THE PREFERRED EMBODIMENTS

It is a feature of a soldering apparatus and a soldering method according to the present invention to perform soldering under a state where bonding targets are heated in advance so that bonding pads thereof come to have high temperatures. The embodiments will be described hereinafter by referring to a case where a magnetic head slider is bonded by solder to a suspension to manufacture a head gimbals assembly that is loaded on a disk device. However, it is noted that the soldering apparatus and the soldering method of the present invention can also be utilized to cases where other bonding targets are to be bonded with each other.

First Embodiment

Figure 7:
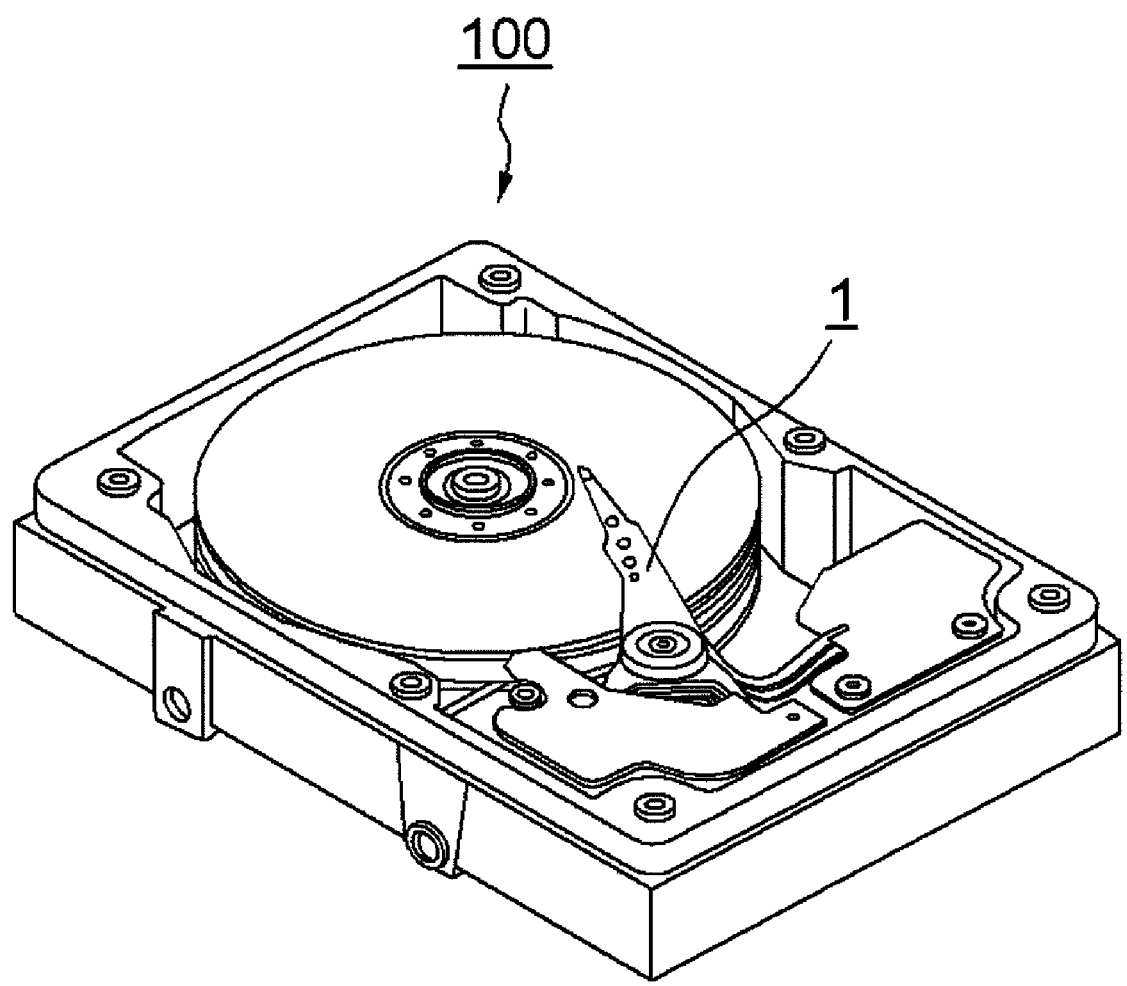
FIG. 7 is an illustration showing a structure of a disk device on which a head gimbals assembly according to the present invention is loaded.
Figure 8:
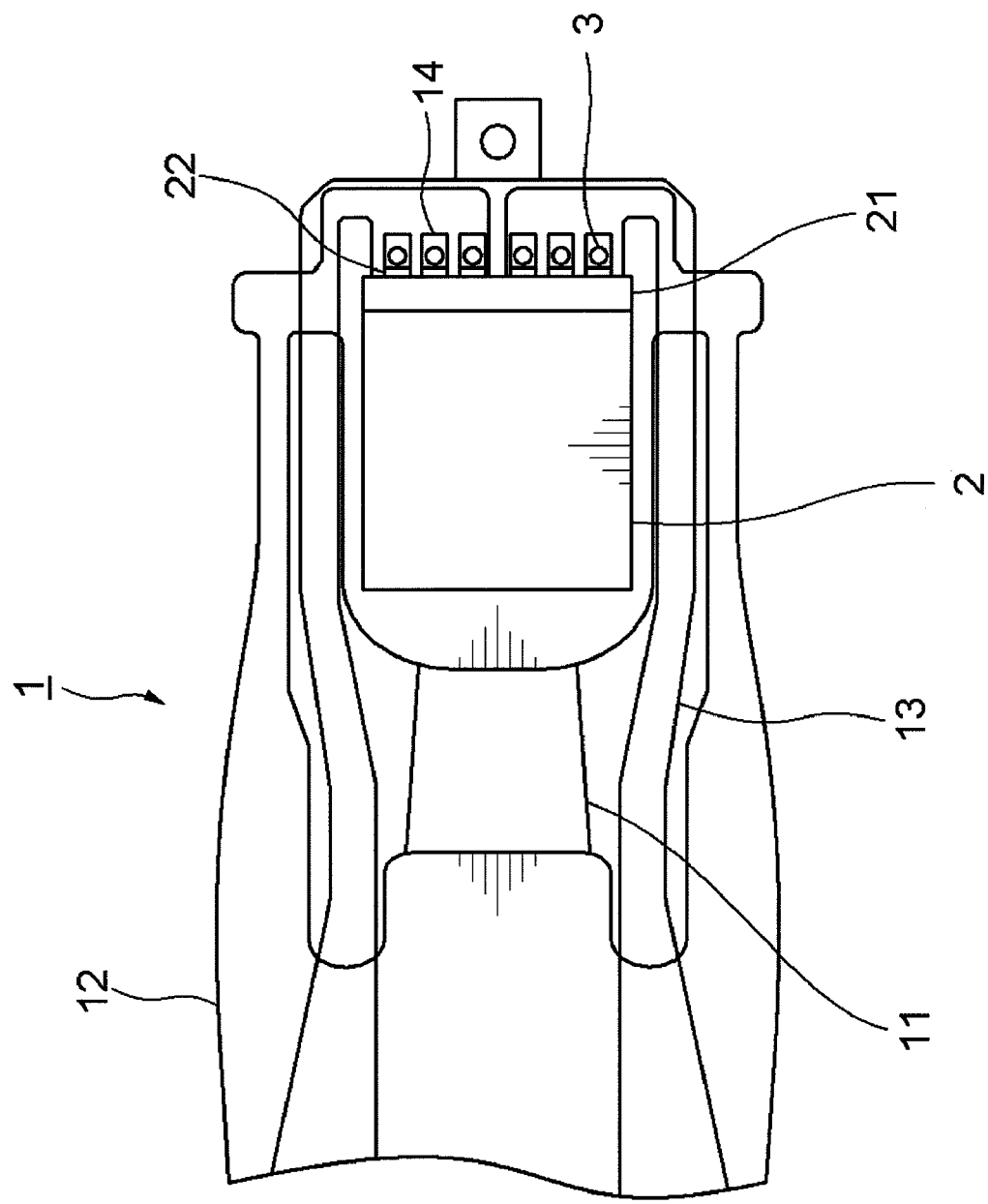
FIG. 8 is an illustration showing the structure of the head gimbals assembly loaded on the disk device disclosed in FIG. 7.
Figure 9:
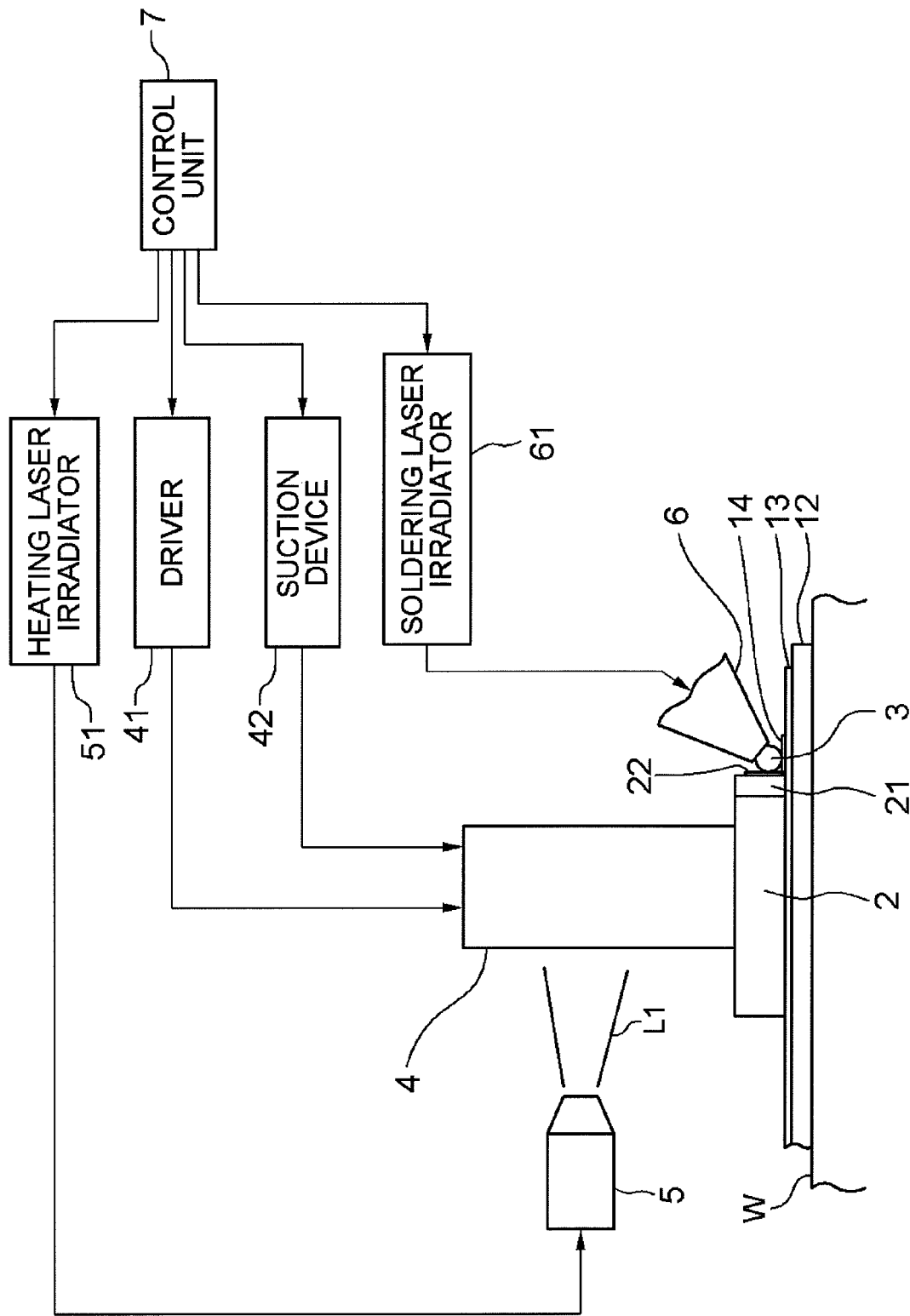
FIG. 9 is a schematic diagram showing an overall structure of a soldering apparatus according to a first embodiment.
Figure 10:
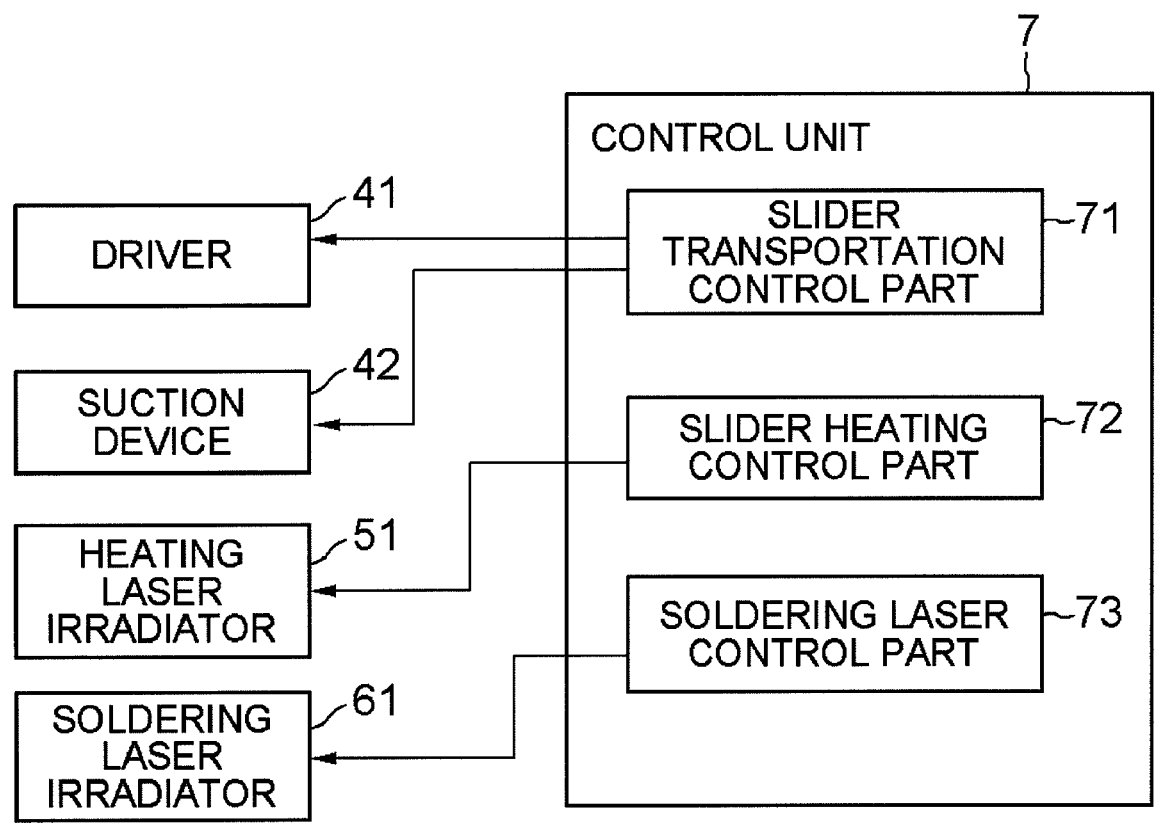
FIG. 10 is a functional block diagram showing a structure of a control unit that constitutes the soldering apparatus disclosed in FIG. 9.
Figure 11:
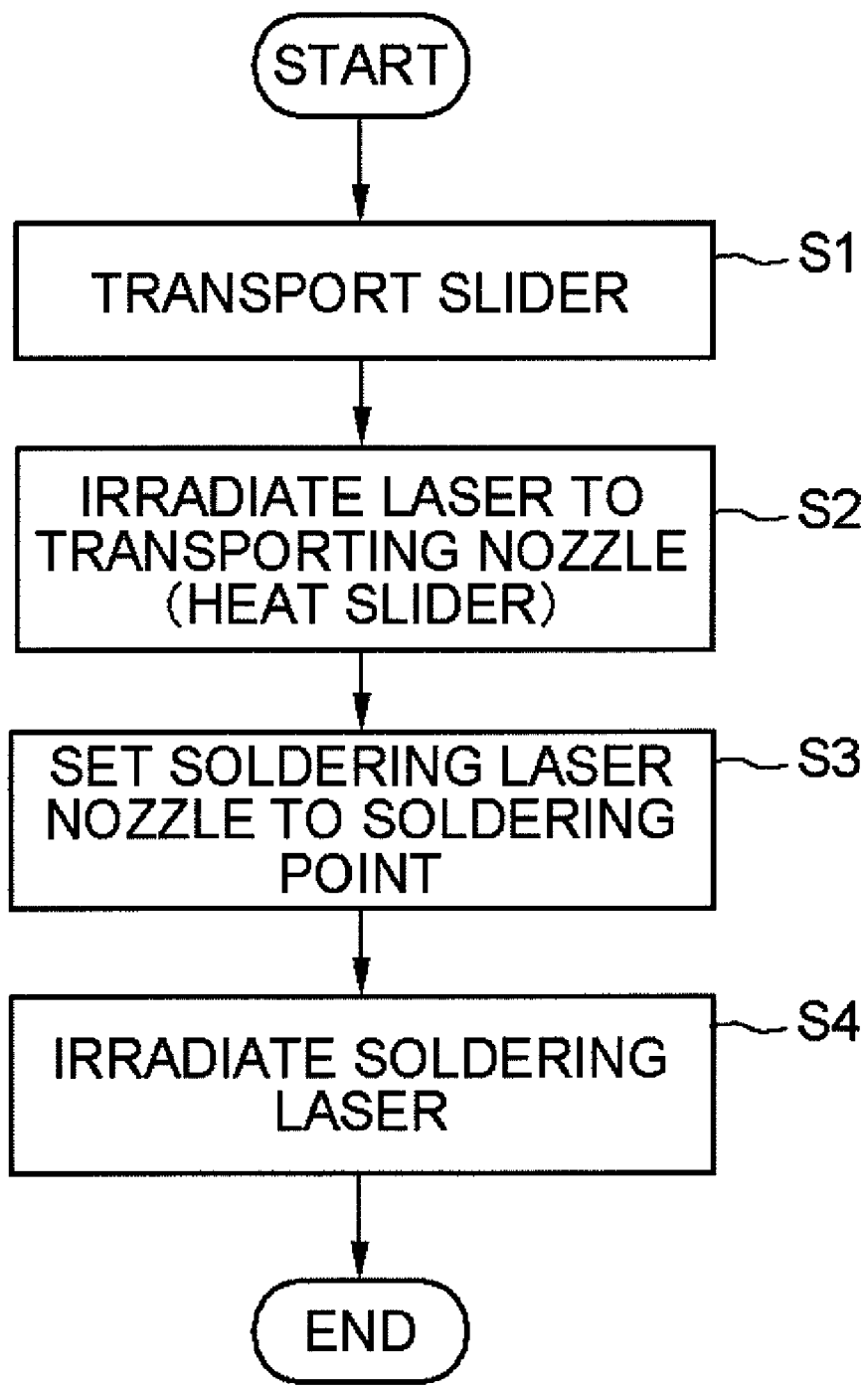
FIG. 11 is a flowchart for showing the procedure of a soldering method according to the first embodiment.

A first embodiment of the present invention will be described by referring to FIG. 7-FIG. 16. FIG. 7 is an illustration for showing a structure of a disk device, and FIG. 8 is an illustration for showing a structure of a head gimbals assembly. FIG. 9-FIG. 10 are illustrations for showing a structure of a soldering apparatus, and FIG. 11 is a flowchart for showing the procedure of a soldering method. FIG. 12-FIG. 16 are illustrations for describing the state of soldering.

(Structure)

First, the soldering apparatus according to this embodiment is used for manufacturing a head gimbals assembly 1 that is loaded on a disk device 100 shown in FIG. 7. Specifically, as shown in FIG. 8, it is used for bonding a magnetic head slider 2 to a flexure 12 and a trace 13 which form a suspension that constitutes the head gimbals assembly 1. Now, the structure of the head gimbals assembly 1 will briefly be described by referring to FIG. 8.

The head gimbals assembly 1 comprises: a suspension having a load beam that is connected to a drive arm (not shown); the flexure 12 joined to the load beam 11; and the trace 13 formed as one body on the flexure 12. Further, the head gimbals assembly 1 comprises the magnetic head slider 2 that is loaded on a suspension tongue part formed in the flexure 12. The trace 13 formed as one body on the flexure 12 is a flexible printed board that is obtained by forming a plurality of signal lines on a polyimide layer, and six bonding pads 14 to be connecting terminals connected to the signal lines are formed on one end side thereof to which the magnetic head slider 2 is loaded. The bonding pads 14 formed on the trace 13 will be referred to as suspension-side pads 14 hereinafter. Further, the magnetic head slider 2 comprises a magnetic head element 21 on one end thereof for performing recording and reproduction of data to/from a disk. Six bonding pads 22 to be input/output terminals of the magnetic head element 21 are formed on the end face of the magnetic head element 21. The bonding pads 22 formed on the magnetic head element 21 (magnetic head slider 2) will be referred to as slider-side pads 22 hereinafter.

The magnetic head slider 2 and the suspension where the trace 13 and the flexure 12 are unified, which constitute the above-described head gimbals assembly, are the targets of soldering, i.e. bonding targets. Specifically, the slider-side pads 22 formed on the magnetic head element 21 of the magnetic head slider 2 and the suspension-side pads 14 formed on the trace 13 are to be solder-bonded.

Next, FIG. 9 shows a structure of a soldering apparatus according to this embodiment, which is used when manufacturing the head gimbals assembly 1 by solder-bonding the magnetic head slider 2 to the trace 13 (flexure 12), which are the bonding targets described above.

As shown in FIG. 9, the soldering apparatus comprises a support stand W (bonding target placing device) for supporting the flexure 12 that constitutes the suspension on which the trace 13 is unified. Further, the soldering apparatus comprises a transporting nozzle 4 (bonding target placing device, transporting device) which holds, with its tip part, the magnetic head slider 2 that is to be bonded to the flexure 12, and transports and places it at a bonding position on the flexure 12. A driver 41 (bonding target placing device, transporting device) is connected to the transporting nozzle 4, and the position of the nozzle is drive-controlled by the driver 41 so that the magnetic head slider 2 that is held at the tip part can be transported. Further, a suction device 42 is connected to the transporting nozzle 4 (suction nozzle), and the tip part of the transporting nozzle 4 is formed substantially in a cylindrical shape. A sucking force is generated by sucking the air from the tip side (lower end side) towards the inner side (upper side). The transporting nozzle 4 holds the magnetic head slider 2 at its tip part by sucking the magnetic head slider 2 towards the upper side by the sucking force.

Further, the soldering apparatus comprises a soldering laser nozzle 6 from which a laser beam (heating beam) for heating the solder 3 is irradiated to the solder bonding point, and a soldering laser irradiator 61 for outputting the laser beam from the soldering laser nozzle 6 (solder heading device). The soldering laser nozzle 6 is structured to be capable of holding the solder ball at its tip part by suction. Therefore, it is possible to irradiate the laser beam to the solder ball 3 while holding the solder ball 3 at the tip part of the nozzle 6 and placing the solder ball 3 at the solder bonding point that is between the slider-side pad 22 and the suspension-side pad 14. The solder ball 3 may also be placed at the bonding point by another device. Further, the solder used for bonding is not limited to be a ball type. For example, paste-type solder may be discharged from the soldering laser nozzle 6 to be supplied to the bonding point.

Further, the embodiment comprises a heating laser nozzle 5, and a heating laser irradiator 51 for outputting a laser beam from the heating laser nozzle 5 (bonding target heating device, bonding target heating beam irradiating device). The heating laser nozzle 5 and the heating laser irradiator 51 are devices different from the soldering laser nozzle 6 and the soldering laser irradiator 61 described above. The heating laser nozzle 5 is located at a position capable of irradiating a laser beam L1 (heating beam) to the transporting nozzle 4 that transports the magnetic head slider 2, and it operates to heat the transporting nozzle 4. With this, the heat from the transporting nozzle 4 heated by the laser beam L1 is transmitted to the magnetic head slider 2 that is held at the tip part of the transporting nozzle 4. That is, since the tip part of the transporting nozzle 4 is in contact with the magnetic had slider 2, the heat is transmitted to the magnetic head slider 2 from the contact area between the transporting nozzle 4 (contact member) and the slider itself.

Furthermore, the soldering apparatus comprises a control unit 7 for controlling the actions of the entire apparatus, i.e. actions of the driver 41, the suction device 42, the heating laser irradiator 51, and the soldering laser irradiator 61. The control unit 7 is constituted with a computer having an arithmetic unit and a storage unit. Prescribed programs are installed to the arithmetic unit of the control unit 7, thereby constituting a slider transportation control part 71, a slider heating control part 72, and a soldering laser control part 73, as shown in FIG. 10.

The slider transportation control part 71 controls the actions of the driver 41 and the suction device 42 to transport the magnetic head slider 2 to the solder bonding position. Specifically, first, the suction device 42 is controlled to generate a sucking force to the transporting nozzle 4 to hold the magnetic head slider 2 at the tip part thereof, and the driver 41 is controlled in this state to move the transporting nozzle 4 to transport the magnetic head slider 2 onto the tongue part of the flexure 12.

Further, the slider heating control part 72 controls the action of the heating laser irradiator 51 to irradiate a laser beam from the heating laser nozzle 5 to the transporting nozzle 4 that holds the magnetic head slider 2, after the magnetic head slider 2 is transported onto the flexure 12 as described above. At this time, the laser output value and output time of the laser beam outputted from the heating laser nozzle 5 are set in advance and stored within the control unit 7, and the slider heating control part 72 controls the output of the laser beam based upon those values. The laser output value and output time set therein are determined based on relations between the outputs of the heating laser nozzle 5 and heated temperatures of the transporting nozzle 4, which are obtained in advance by experiments, theoretical expressions, and the like. For example, the laser output values and the output time are so set that the transporting nozzle 4 can be heated to a temperature within the range of 70 degrees to 150 degrees (for example, 100 degrees) with which the magnetic head 2 is not damaged, for example. That is, in this case, the output of the heating laser nozzle 5 is controlled so that heat is applied so as not to exceed the temperature that may give damages to the bonding target that is the magnetic head slider 2.

Further, the soldering laser control part 73 controls the action of the soldering laser irradiator 61 to irradiate a laser beam from the soldering laser nozzle to the solder ball 3 that is held at the tip part thereof. Thereby, the solder ball 3 is fused and the each of the pads 22 and 14 are soldered to each other. At this time, timing for irradiating the soldering laser beam is so controlled that soldering is started after the magnetic head slider 2 is transported by the transporting nozzle 4 onto the flexure 12 and the transporting nozzle 4 is heated by the heating laser nozzle 5 for the set length of time as described above. Then, the soldering laser nozzle 6 irradiates a laser beam L2 to the solder ball 3 with the intensity and for the length of time set in advance. The intensity and the time of the laser beam outputted from the soldering laser beam 6 are set to apply an amount of heat with which the solder ball 3 is sufficiently fused sufficiently and with which the flexure 12 and the trace 13 are not excessively heated. The values thereof are determined in advance by an experiment or the like, for example. In this embodiment, the energy amount of the laser beam irradiated to the solder ball 3 is less than that of the case of the related technique described above. For example, as will be described later by referring to FIG. 16, it becomes possible to perform soldering with almost a half the energy amount compared to that of the above-described case.

The soldering laser control part 73 controls the action of the driver and the suction device, which are not shown, so as to drive-control positions of the soldering laser nozzle 6, control sucking/holding action of the solder ball 3 to the tip part of the soldering laser nozzle 6, etc.

Note here that the slider heating control part 72 may irradiate the laser beam L1 to the transporting nozzle 4 from the heating laser nozzle 5 to heat the magnetic head slider 2 indirectly, not only before starting irradiation of the soldering laser beam by the above-described soldering laser control part 73 but also while the soldering is executed by irradiating the laser beam to the solder ball 3. The magnetic head slider 2 may also be heated only before starting the soldering or may only be heated simultaneously during the irradiation of the soldering laser.

(Operations)

Next, operations of the soldering apparatus having the above-described structure, i.e. operations of a soldering method according to the present invention, will be described by referring to a flowchart of FIG. 11, illustrations of FIG. 12-FIG. 15 which show the state at the time of soldering, and energy measurement data shown in FIG. 16.

Figure 1A:
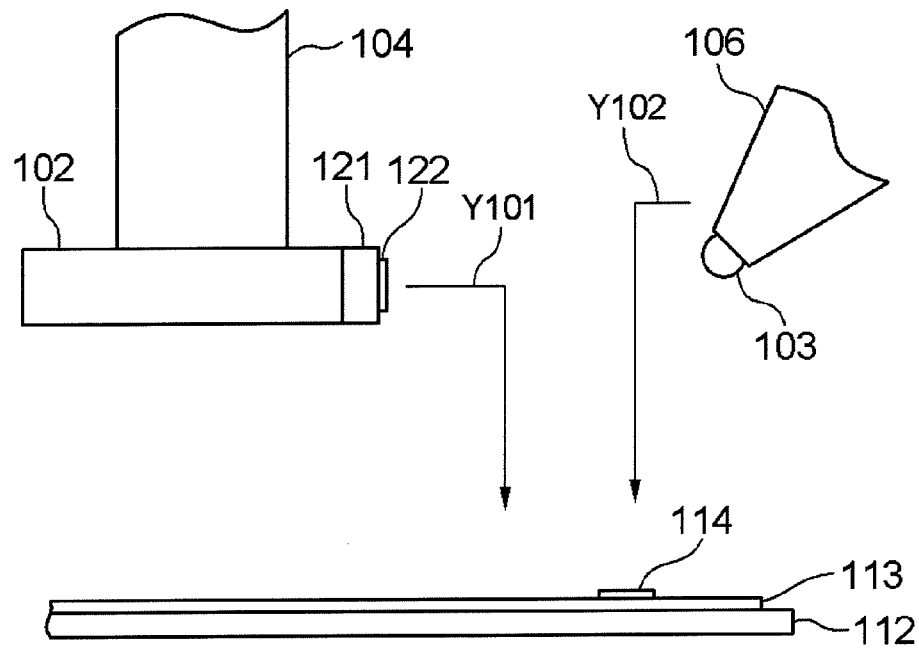
FIG. 1A is an illustration for describing a state of soldering performed by a soldering method according to a related technique of the present invention.

First, as in the case of the above-described conventional technique shown in FIG. 1A, the magnetic head slider 2 is sucked and held at the tip part of the transporting nozzle 4, and it is transported onto the flexure 12 (step S1, bonding target placing step, bonding target transporting step). At this time, the magnetic head slider 2 is loaded on the tongue part of the flexure 12 in such a manner that the slider-side pad 22 of the magnetic head slider 2 and the suspension-side pad 14 formed in the trace 13 on the flexure 12 are arranged at almost right angles to each other.

Figure 12:
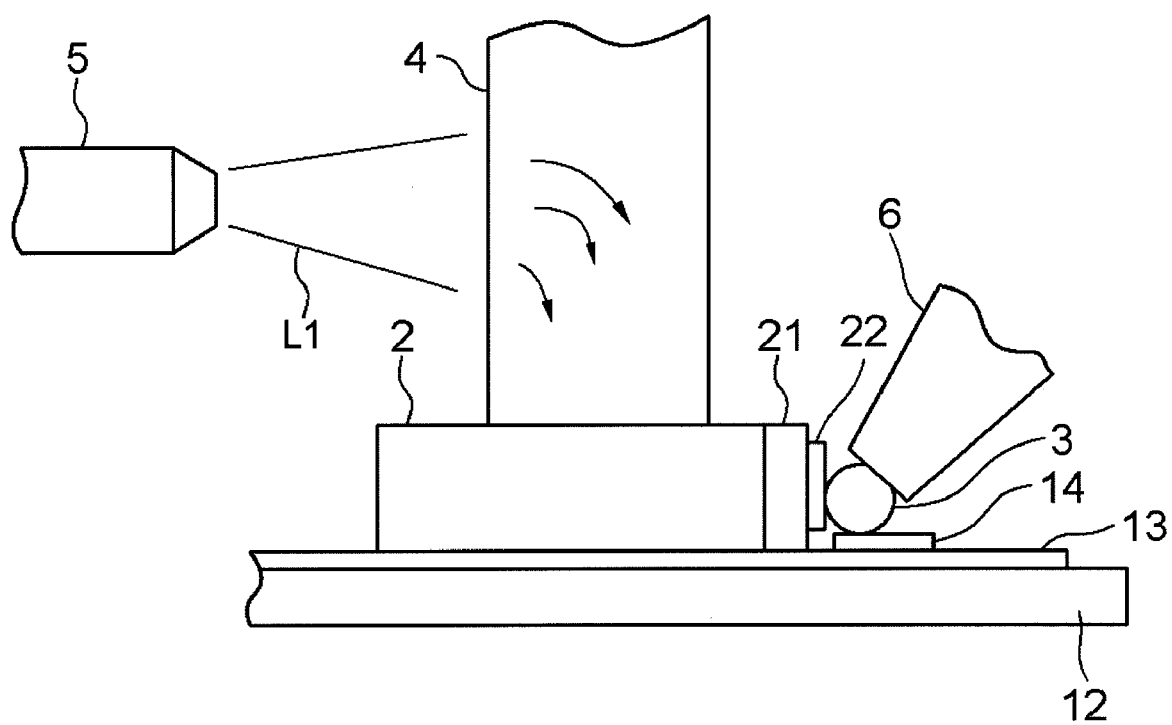
FIG. 12 is an illustration for describing a state of soldering according to the first embodiment.

Subsequently, as shown in FIG. 12, the laser beam L1 is irradiated to the transporting nozzle 4 from the heating laser nozzle 5 (step S2, bonding target heating step). Upon this, as shown with arrows of FIG. 12, the transporting nozzle 4 is heated by the laser beam L1 that is outputted from the heating laser nozzle 5. At this time, for example, it is controlled to irradiate a prescribed output value of the laser beam for a prescribed time.

Figure 13:
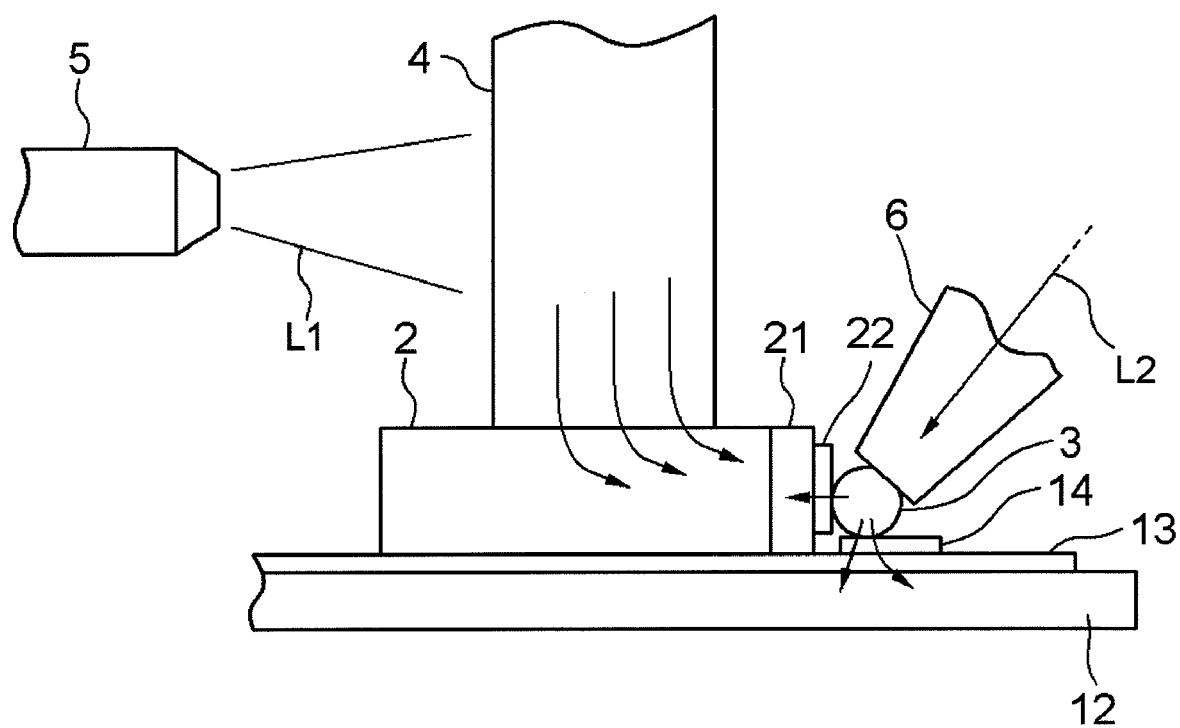
FIG. 13 is an illustration for describing the state of soldering according to the first embodiment, which shows the state following that of FIG. 12.
Figure 14:
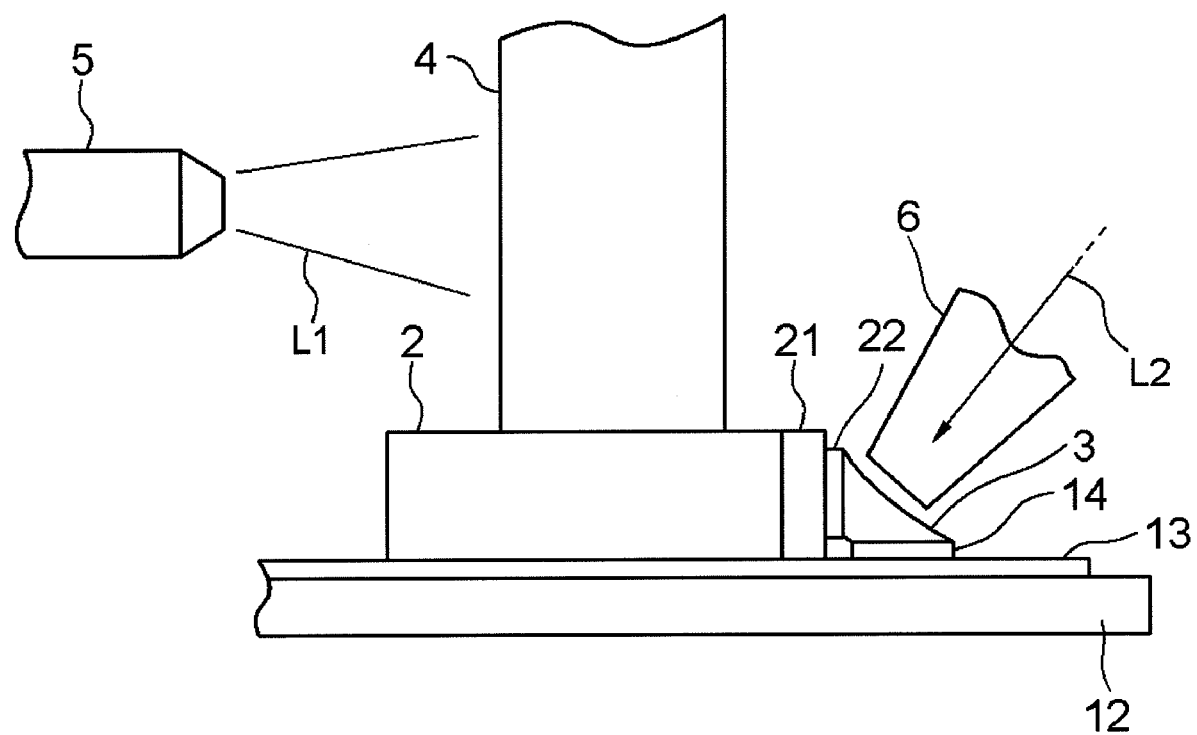
FIG. 14 is an illustration for describing the state of soldering according to the first embodiment, which shows the state following that of FIG. 13.

Upon this, the heat of the heated transporting nozzle 4 is transmitted to the magnetic head slider 2 that is in contact with the transporting nozzle 4 from the tip part thereof, as shown with arrows of FIG. 13. Thereby, the magnetic head slider 2 is heated to a predetermined temperature, e.g. 100 degrees. In the meantime, it is possible to prevent an amount of heat that may give damages to the magnetic head slider, the trace 13, and the like from being applied thereto through controlling the irradiation time and the like of the laser beam L1 outputted from the heating laser nozzle 5. The heating laser nozzle 5 may be mounted to be movable, so that it may be moved by corresponding to the position of the transporting nozzle 4 while the magnetic head slider 2 is being transported so as to irradiate the laser beam L1 to the transporting nozzle 4 during the transporting action.

Figure 1B:
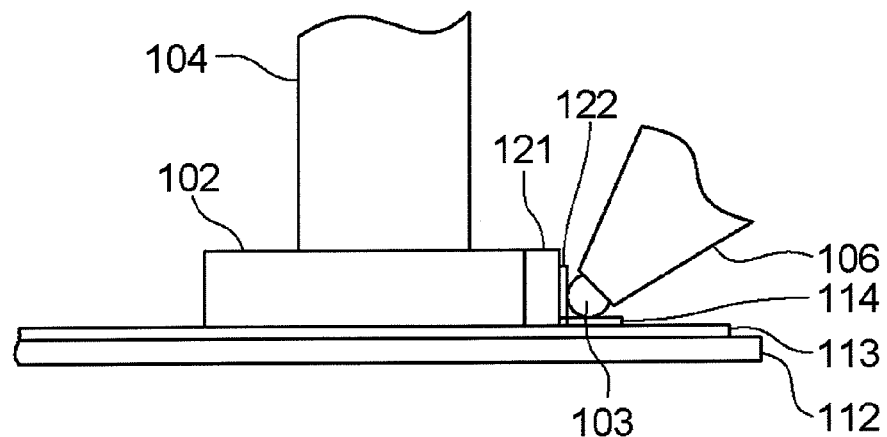
FIG. 1B is an illustration for describing the state of soldering performed by the soldering method according to the related technique of the present invention, which shows the sate following that of FIG. 1A.

Then, the solder ball 3 is sucked and held at the tip part of the soldering laser nozzle 6 and, as in the case of FIG. 1B, the soldering laser nozzle 6 is placed in such a manner that the solder ball 3 comes between the slider-side pad 22 and the suspension-side pad 14 (step S3). The solder ball 3 may be placed between each of the pads 22 and 14 at any timing during, after, or before applying heat to the magnetic head slider 2 by the heating laser beam L1 as described above. For example, it may be executed simultaneously at the time of transporting the magnetic head slider 2.

Thereafter, as shown in FIG. 13, the laser beam L2 is irradiated from the soldering laser nozzle 6 (step S4), and the solder ball 3 is heated (soldering step). At this time, the laser beam L2 is irradiated with the intensity and for a length of time set in advance. As shown in FIG. 16, compared to the energy amount applied in the case of the conventional technique shown in FIG. 6A, only about a half the energy is applied, for example.

Figure 2A:
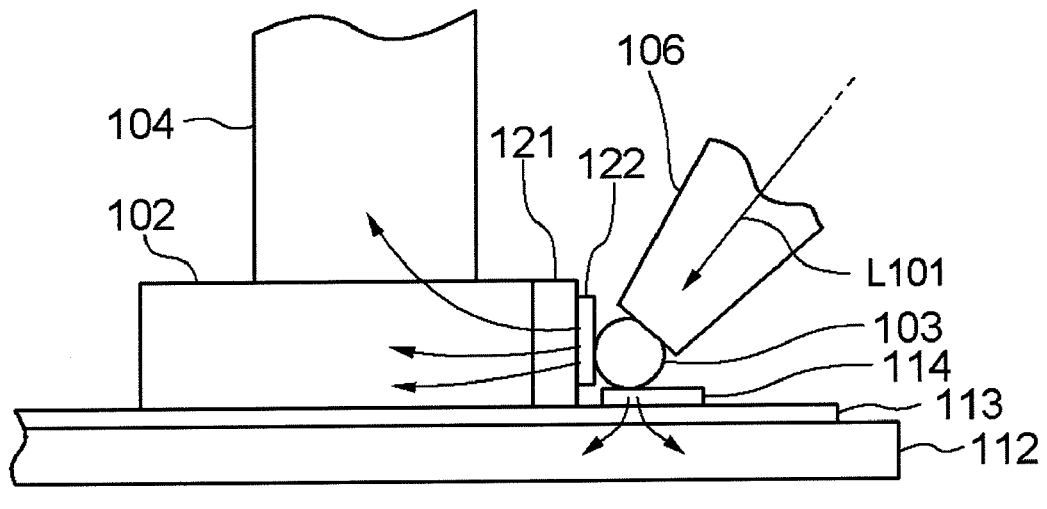
FIG. 2A is an illustration for describing the state of soldering performed by the soldering method according to the related technique of the present invention, which shows the sate following that of FIG. 1B.
Figure 2B:
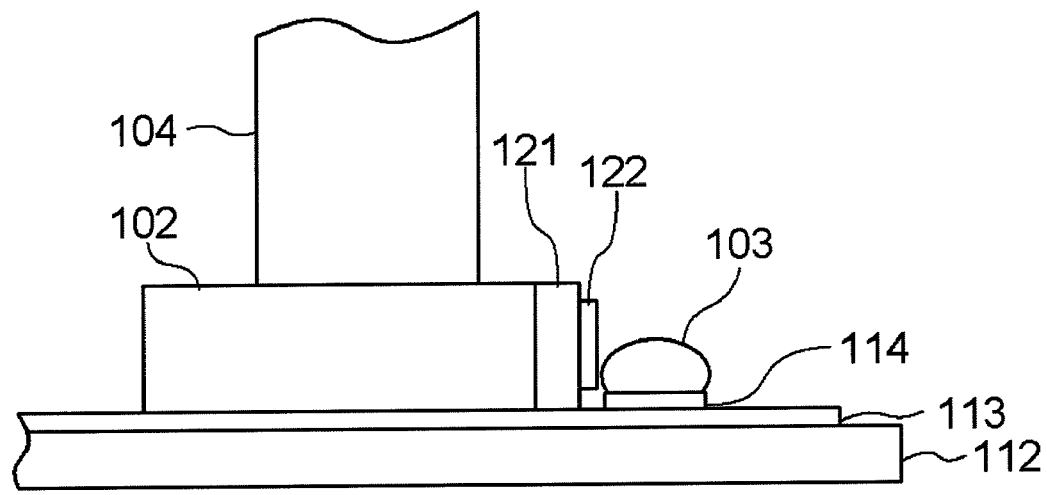
FIG. 2B is an illustration for describing the state of soldering performed by the soldering method according to the related technique of the present invention, which shows the sate following that of FIG. 2A.
Figure 3A:
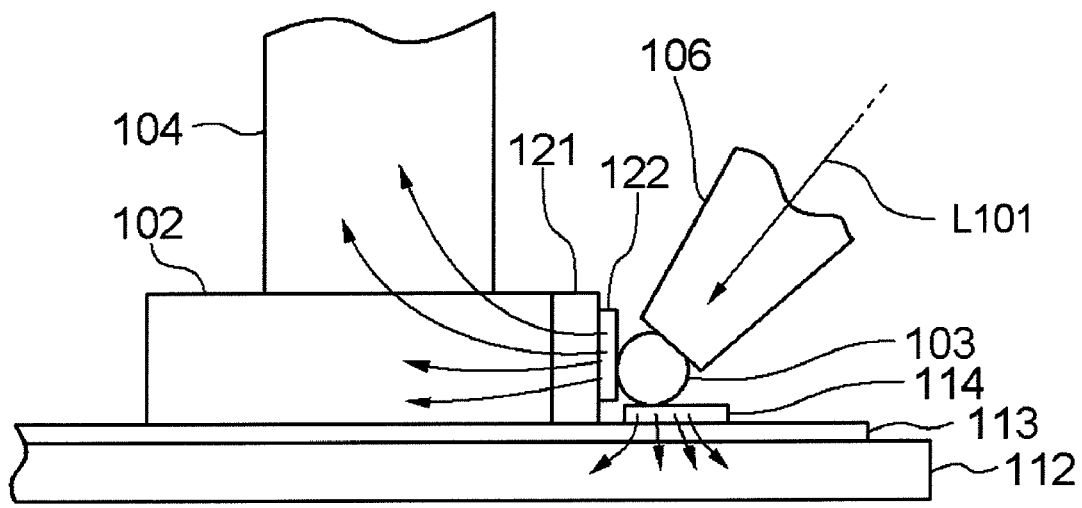
FIG. 3A is an illustration for describing the state of soldering performed by the soldering method according to the related technique of the present invention, which shows the sate following that of FIG. 1B.
Figure 3B:
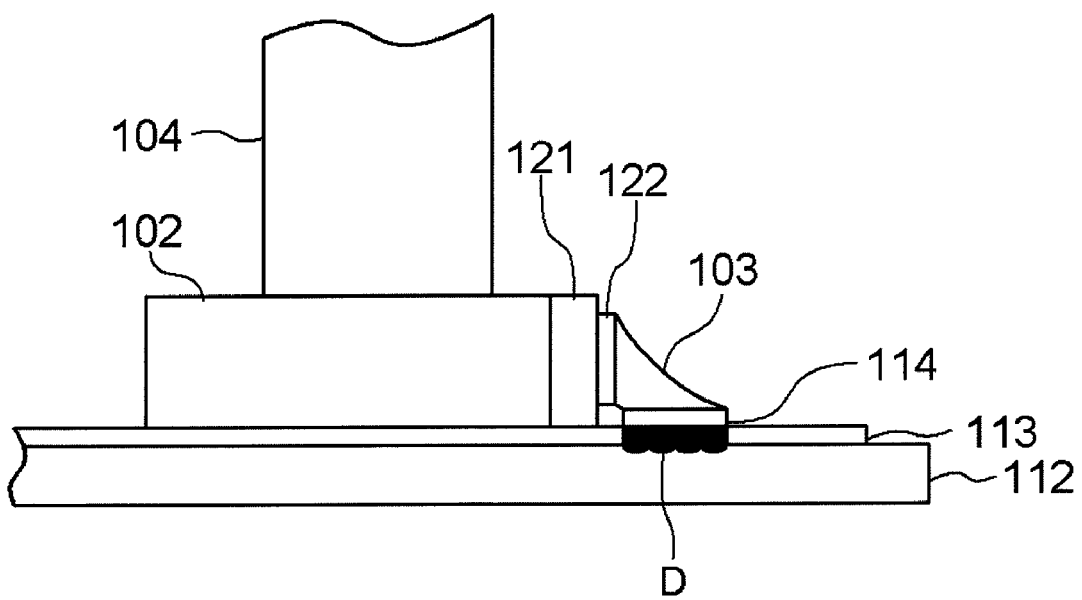
FIG. 3B is an illustration for describing the state of soldering performed by the soldering method according to the related technique of the present invention, which shows the sate following that of FIG. 3A.
Figure 4A:
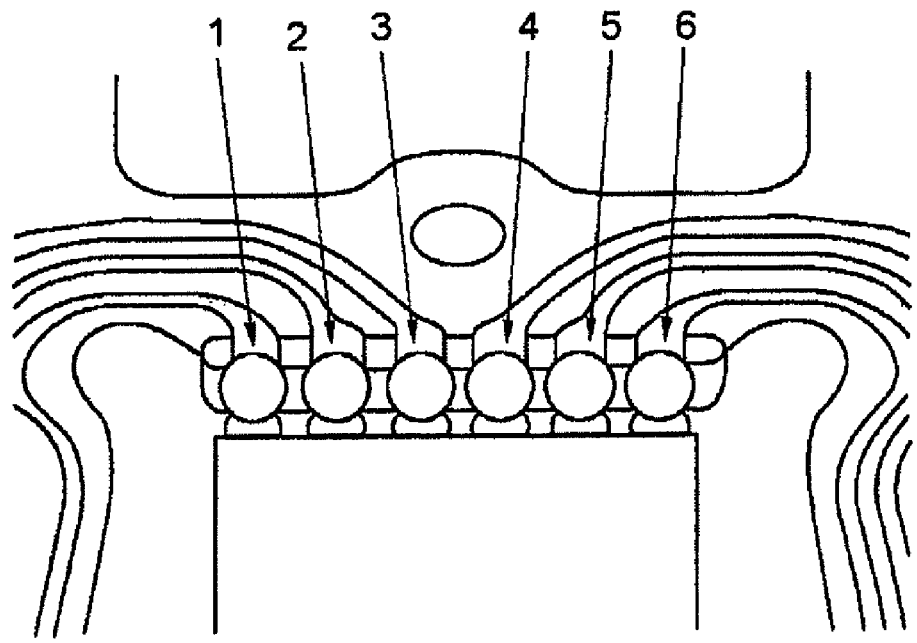
FIG. 4A is a photograph showing a head gimbals assembly taken from a magnetic head slider side, when solder is tentatively fixed by the soldering method according to the related technique of the present invention.
Figure 4B:
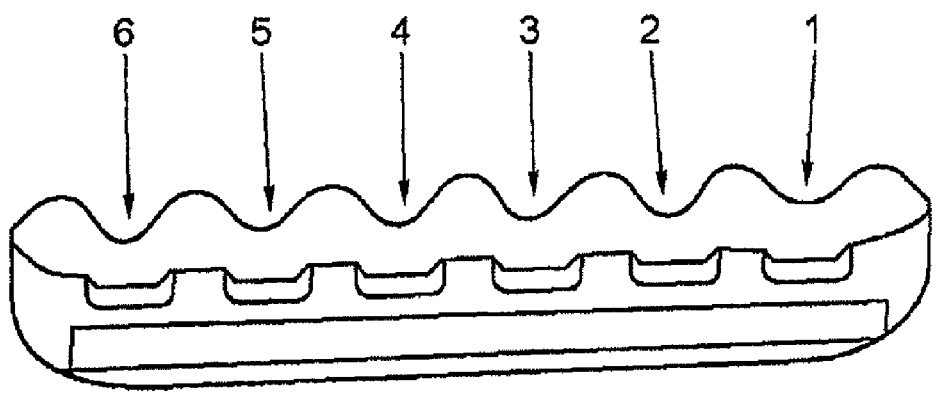
FIG. 4B is a photograph showing the head gimbals assembly taken from the back face side of the magnetic head slider, when the solder is tentatively fixed by the soldering method according to the related technique of the present invention.
Figure 5A:
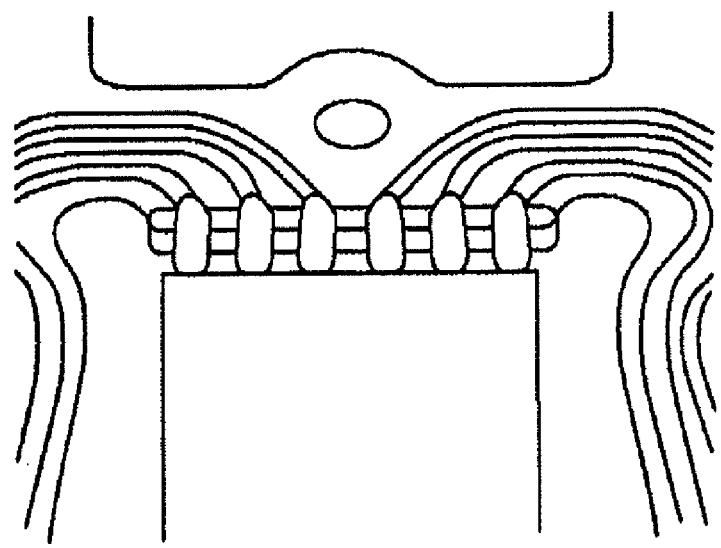
FIG. 5A is a photograph showing the head gimbals assembly taken from the magnetic head slider side, when the solder is tentatively fixed by the soldering method according to the related technique of the present invention.
Figure 5B:
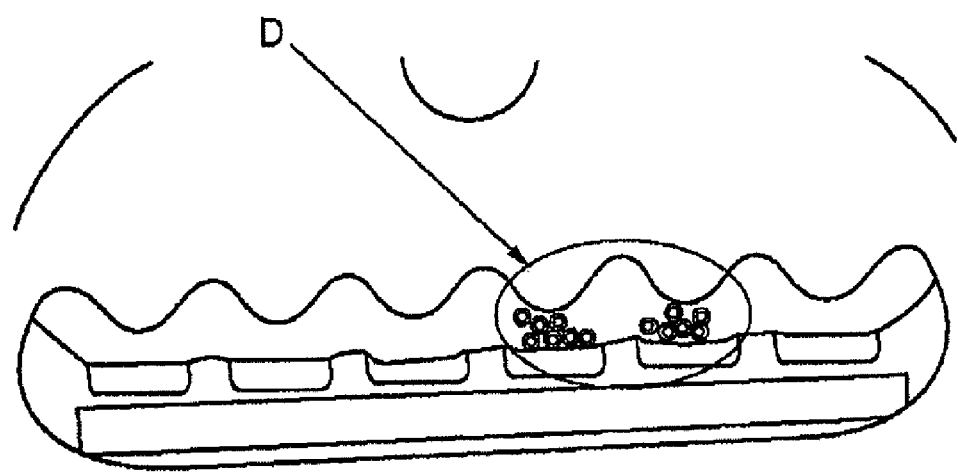
FIG. 5B is a photograph showing the head gimbals assembly taken from the back face side of the magnetic head slider, when the solder is tentatively fixed by the soldering method according to the related technique of the present invention.

The transporting nozzle 4 is in contact with the magnetic head slider 2 and also a sucking force is applied to the magnetic head slider 2 form the nozzle 4, so that a part of the magnetic head slider 2 near the slider-side pad 22 has a high heat radiation rate (see FIG. 2A), thereby exhibiting a low temperature increase rate. However, since the magnetic head slider 2 is indirectly heated by the laser beam L1 from the above-described heating laser nozzle 5, the temperature of the slider-side pad 22 is also set to be high. Thus, even if the amount of heat applied to the solder ball 3 by the soldering laser nozzle 6 is small, it is possible to achieve highly reliable soldering as in the case of solder 3 shown in FIG. 14. At the same time, as shown with arrows of FIG. 13, excessive heating for the magnetic head slider 2 and the trace 13 can be suppressed. Therefore, such a damage shown with a reference code D in FIG. 5B described in the conventional technique can be prevented. Further, the time for soldering can be shortened.

Figure 15A:
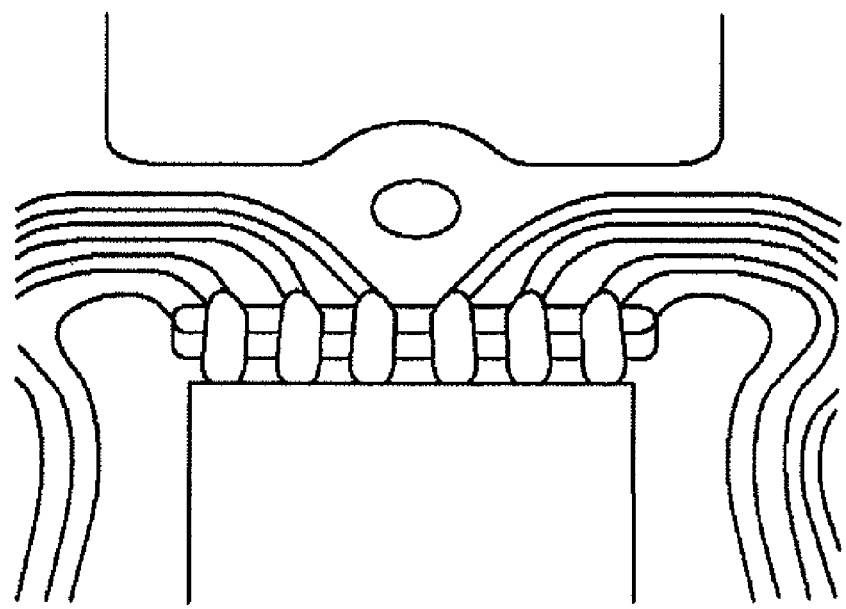
FIG. 15A is a photograph showing the head gimbals assembly taken from the magnetic head slider side, when the solder is tentatively fixed by the soldering method according to the present invention.
Figure 15B:
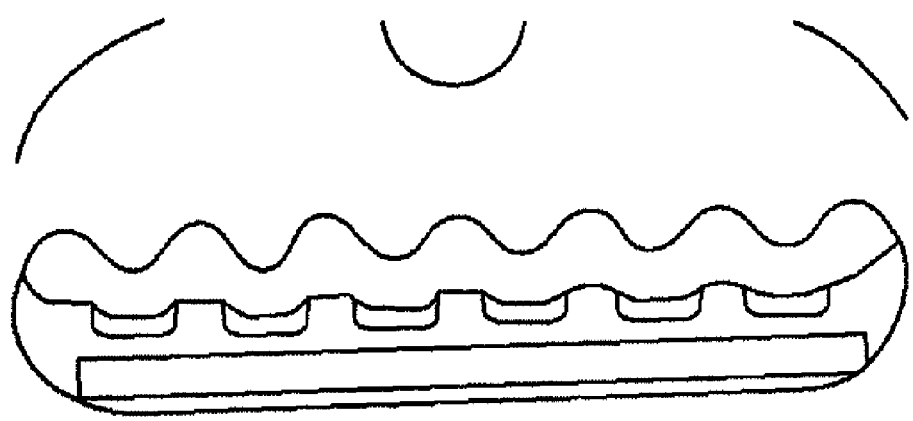
FIG. 15B is a photograph showing the head gimbals assembly taken from the back face side of the magnetic head slider, when the solder is tentatively fixed by the soldering method according to the present invention.

FIG. 15A and FIG. 15B are photographs showing a soldered part of a head gimbals assembly to which soldering is actually performed. FIG. 15A is a photograph of the bonding pad part of the head gimbals assembly viewed from the magnetic head slider 2 side, and FIG. 15B is a photograph viewed from the back face side thereof (from the polyimide layer 13 side of the flexible printed board). These photographs show a case of performing soldering by applying almost a half the energy only compared to the case described in the conventional technique, as shown in FIG. 16. As can bee seen from these photographs, there is no damage on the polyimide layer 13 and the like, unlike the case of the conventional technique. Further, it can be seen that the solder ball 3 is fused completely, and that highly reliable soldering is achieved.

Furthermore, in this embodiment, the magnetic head slider 2 is indirectly heated via the transporting nozzle 4 that is in contact with the slider 2. Thus, the magnetic head slider 2 is not heated directly from a heat source such as irradiating the laser beam. Therefore, it is possible to suppress abrupt heating, thereby making it possible to suppress damages by such heating effectively.

Further, in the above described case, the transporting nozzle 4 holds the magnetic head slider 2 by suction, so that the heat radiation rate of the magnetic head slider 2 on the slider-pad side becomes high and the temperature increase rate becomes still lower due to an influence of the air flow generated in accordance with the suction and the transporting nozzle 4 that is in contact with the slider 2. Therefore, when manufacturing the head gimbals assembly 1 as in this embodiment, it is desirable to perform soldering by hating the magnetic head slider 2 where the temperature is assumed to become low. With this, damages to the head gimbals assembly can be suppressed, so that the quality of the products can be improved. As a result, quality of the disk device that requires a high reliability can be further improved, and the cost thereof can be reduced as well.

Heating of the transporting nozzle 4 by the heating laser nozzle 5 may be performed while transporting the magnetic head slider 2, during execution of soldering by irradiating the laser beam to the solder ball 3 from the soldering laser nozzle 6, etc. For example, through heating the transporting nozzle 4 while transporting the magnetic head slider 2, it becomes possible to irradiate a laser beam for soldering immediately after transporting the slider 2 to the soldering point. Therefore, efficiency of the soldering work can be improved, and the time for soldering can be shortened.

Further, while it has been described in the above by referring to the case of heating the magnetic head slider 2 by applying a certain heat amount to the transporting nozzle 4 from the heating laser nozzle 5, a temperature sensor may be attached to the transporting nozzle 4 so as to control the irradiation of the laser beam L1 from the heating laser nozzle 5 by the slider heating control part 73 such that the temperature of the transporting nozzle 4 has a constant value (for example, 100 degrees) at all times.

Furthermore, while it has been described in the above by referring to the case of soldering the slider-side pad 22 formed in the magnetic head element side of the magnetic head slider 2, the embodiment can also be used in a case where the bonding pad formed on the end face that is opposite from the magnetic head element 21 is soldered to the suspension (flexure 12) for fixing the magnetic head slider 2 to the suspension (flexure 12).

Second Embodiment

Figure 17:
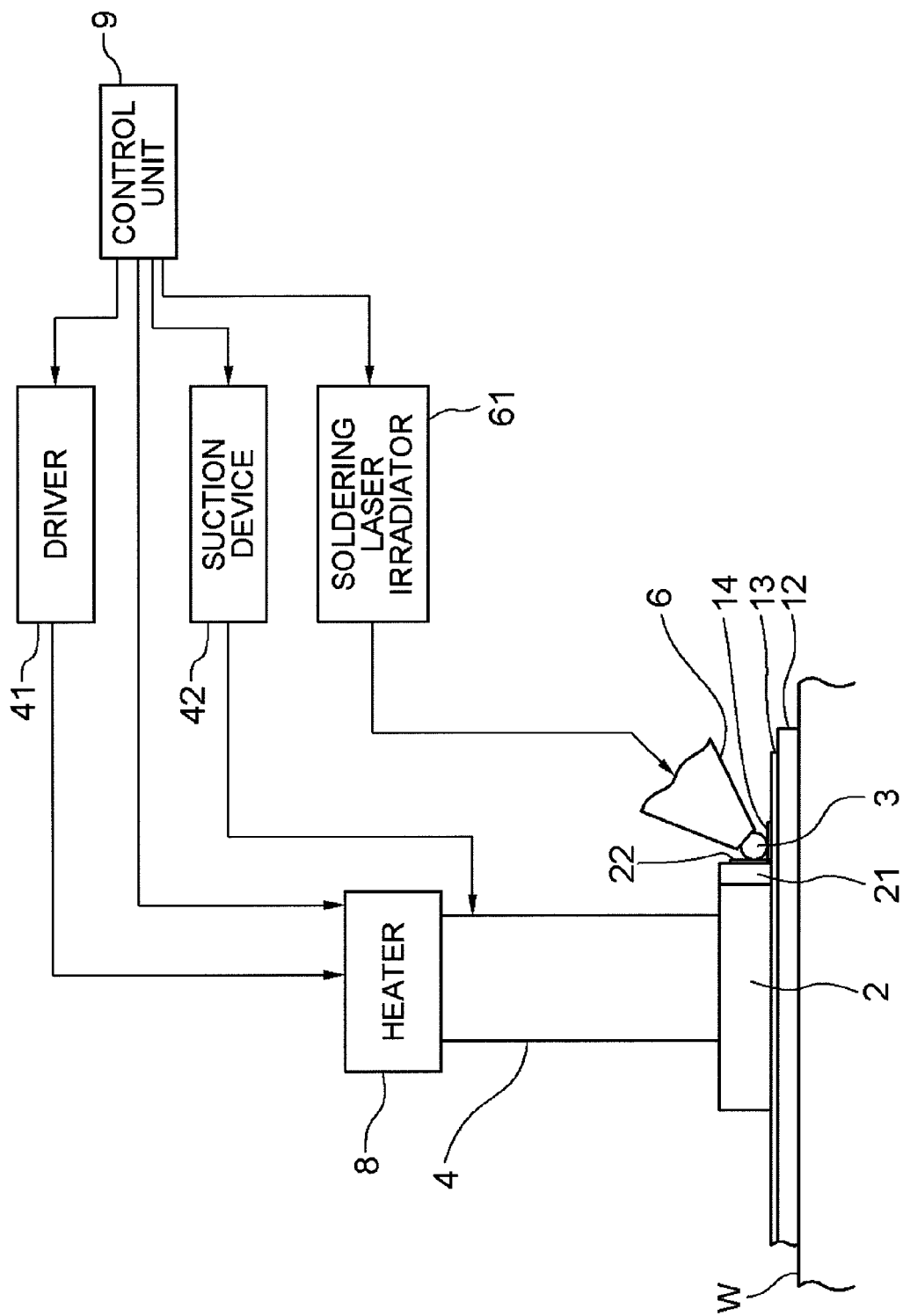
FIG. 17 is a schematic diagram showing an overall structure of a soldering apparatus according to a second embodiment.
Figure 18:
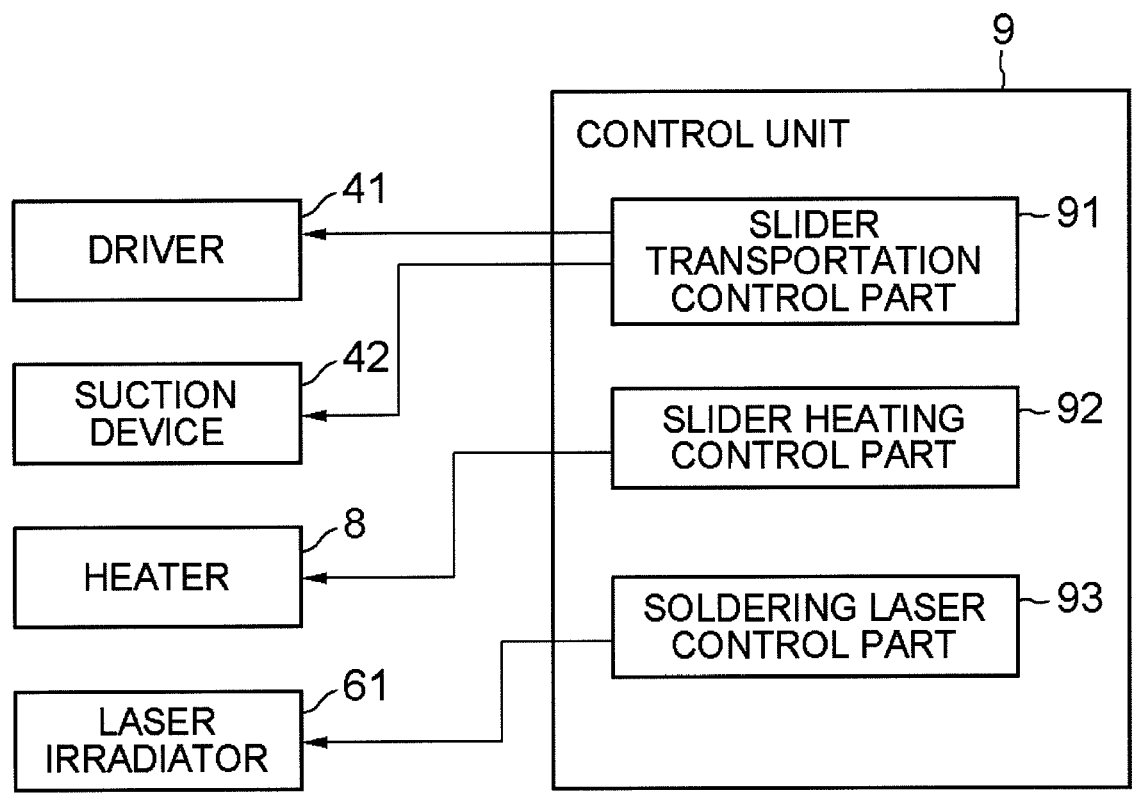
FIG. 18 is a functional block diagram showing a structure of a control unit that constitutes the soldering apparatus disclosed in FIG. 17.
Figure 19:
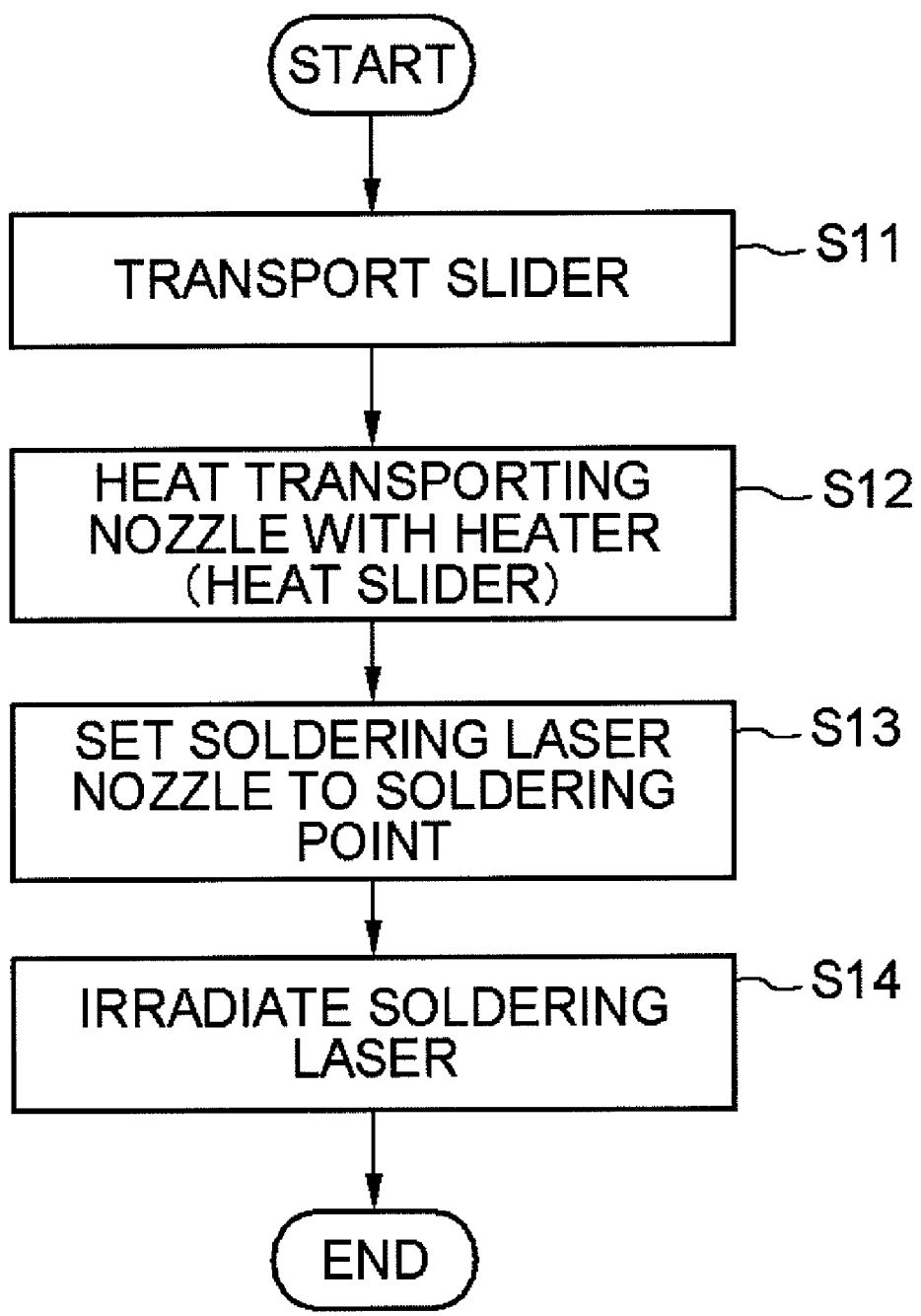
FIG. 19 is a flowchart for showing the procedure of a soldering method according to the second embodiment.
Figure 20:
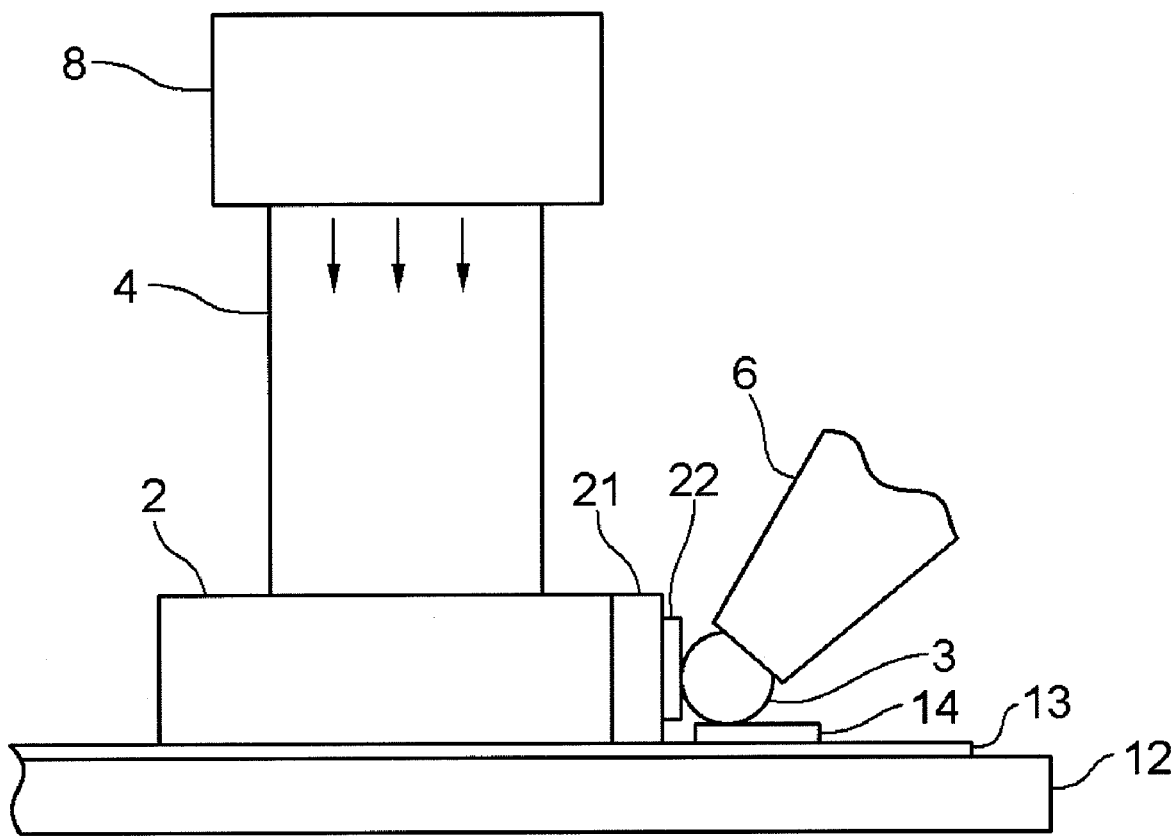
FIG. 20 is an illustration for describing a state of soldering according to the second embodiment.
Figure 21:
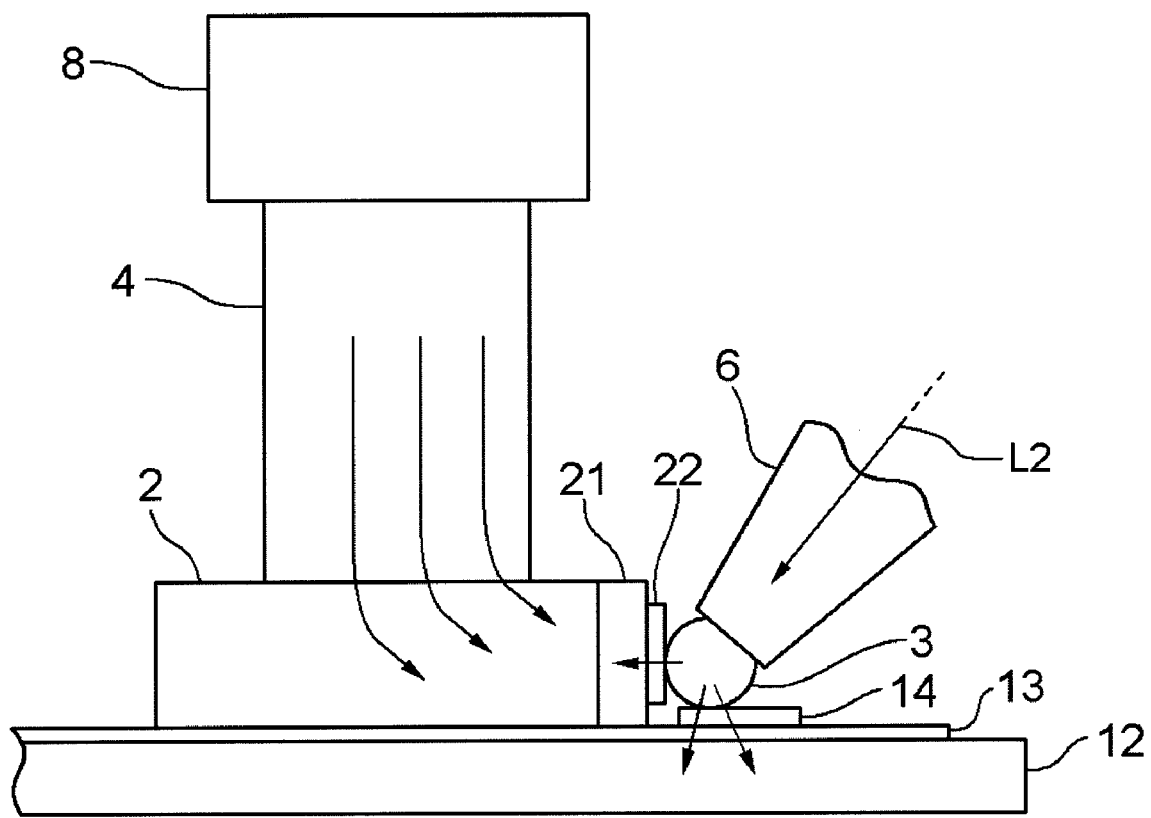
FIG. 21 is an illustration for describing the state of soldering according to the second embodiment, which shows the state following that of FIG. 20.
Figure 22:
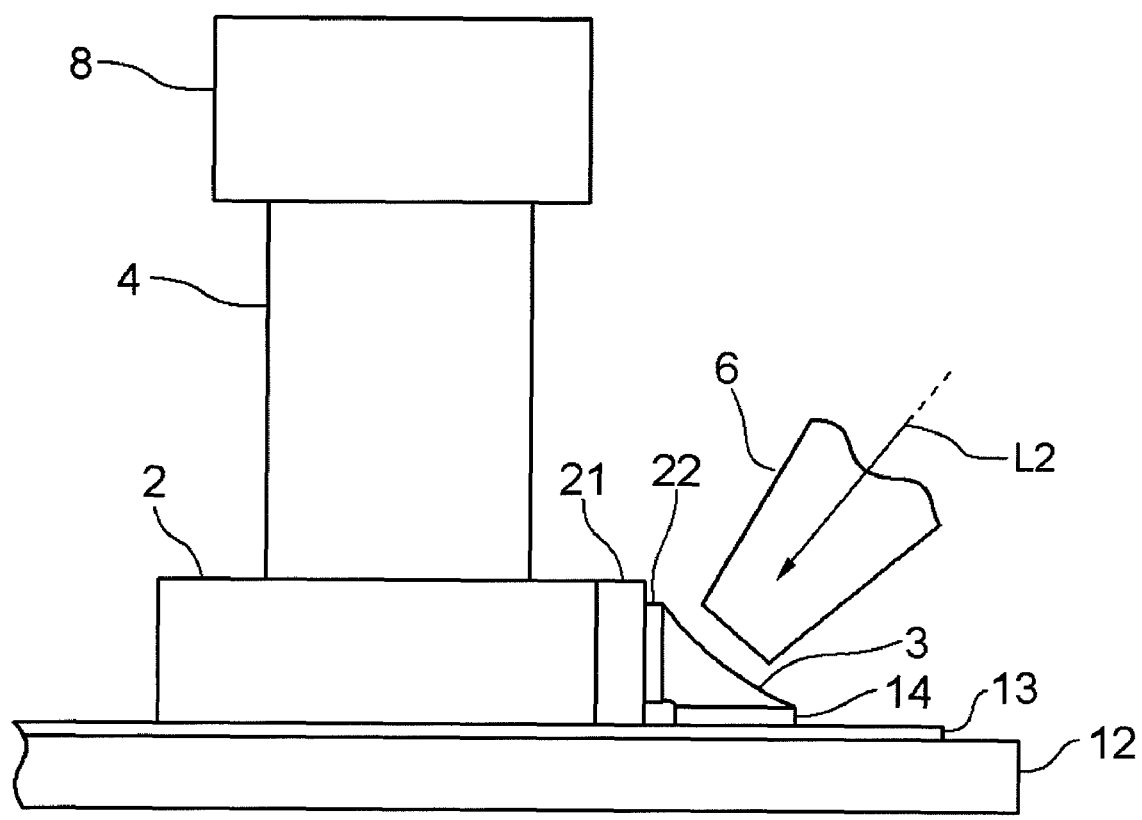
FIG. 22 is an illustration for describing the state of soldering according to the second embodiment, which shows the state following that of FIG. 21.

A second embodiment of the present invention will be described by referring to FIG. 17-FIG. 22. FIG. 17 and FIG. 18 are illustrations for showing a structure of a soldering apparatus, and FIG. 19 is a flowchart for showing the procedure of a soldering method. FIG. 20-FIG. 22 are illustrations for describing the state of soldering.

(Structure)

First, as in the case of the above-described first embodiment, the soldering apparatus according to this embodiment is used for bonding a magnetic head slider 2 to a flexure 12 and a trace 13 which form a suspension that constitutes a head gimbals assembly 1.

As shown in FIG. 17, the soldering apparatus according to this embodiment comprises: a transporting nozzle 4 for transporting the magnetic head slider 2 to the tongue part of the flexure 12 to which the trace 13 is unified to constitute the suspension that is loaded on a support stand W; a driver 41 for driving the nozzle 4; a suction device 42 for giving a sucking force to suck and hold the magnetic head slider 2 at the tip part of the transporting nozzle 4; a soldering laser nozzle 6 from which a laser beam is irradiated for heating the solder 3 at the solder bonding point; and a soldering laser irradiator 61 for outputting the laser beam from the soldering laser nozzle 6. Further, the soldering apparatus comprises a control unit 9 for controlling the actions thereof. Prescribed programs are installed to the control unit 9, thereby constituting: a slider transportation control part 91 which controls the action of the above-described driver 41 and the suction device 42 to transport the magnetic head slider 2 to the soldering position; and a soldering laser control part 93 which controls the action of the soldering laser irradiator 61 to control irradiation of the laser beam from the soldering laser nozzle 6 to the solder ball 3 that is held at the tip part. These structures are the same as those of each structure provided to the soldering apparatus of the above-described first embodiment, so that detailed explanations thereof will be omitted.

Further, as shown in FIG. 17, a heater 8 (bonding target heating device, heating device) which is constituted with a heating element, for example, is provided to be in contact with the transporting nozzle 4 in this embodiment. In accordance with this, a prescribed program is installed to the control unit 9 to constitute a slider heating control part 92 for controlling the heating action of the heater 8. The slider heating control part 92 controls the heater 8 based upon values that are set for the heating output values and heating time of the heater 8, which are stored in the control unit 9 in advance. The laser output values and output time set therein are values indicating relations between the output value as well as the heating time of the heater 8 and heated temperatures of the transporting nozzle 4, which are obtained in advance by experiments, theoretical expressions, and the like. Specifically, the output value and the heating time of the heater 8 are so set that the transporting nozzle 4 can be heated a temperature within the range of 70 degrees to 150 degrees (for example, 100 degrees) with which the magnetic head 2 is not damaged. That is, in this case, the output of the heater 8 is controlled to so that heat is applied so as not to exceed the temperature that may give damages to the bonding target that is the magnetic head slider 2.

Further, the slider heating control part 92 controls generation of heat in the heater 8 before starting irradiation of the soldering laser beam by the soldering laser control part 93 (for example, while the slider 2 is being transported), or during execution of soldering by irradiating the solder laser beam to the solder ball 3. With this, the heat from the transporting nozzle 4 that is heated by the heater 8 is transmitted to the magnetic head slider 2 held at the tip part of the transporting nozzle 4, so that the temperature of the magnetic head slider 2, i.e. the temperature of the slider-side pad 22, is increased.

(Operations)

Next, operations of the soldering apparatus having the above-described structure, i.e. operations of a soldering method according to the present invention, will be described by referring to a flowchart of FIG. 19, and illustrations of FIG. 20-FIG. 22 which show the state at the time of soldering.

First, as in the case of the above-described conventional technique shown in FIG. 1A, the magnetic head slider 2 is sucked and held at the tip part of the transporting nozzle 4, and it is transported onto the flexure 12 (step S11, bonding target placing step, bonding target transporting step). At this time, the magnetic head slider 2 is loaded on the tongue part of the flexure 12 in such a manner that the slider-side pad 22 of the magnetic head slider 2 and the suspension-side pad 14 formed in the trace 13 on the flexure 12 are arranged at almost right angles to each other.

Subsequently, or while transporting the magnetic head slider 2, the heater 8 is heated. Upon this, as shown with arrows of FIG. 20, the heat is transmitted to the transporting nozzle 4 from the heater 8, so that the transporting nozzle 4 is heated (step S12, bonding target heating step). At this time, the heater 8 is controlled to output a prescribed output value and for a prescribed length of time, for example. Upon this, as shown with arrows of FIG. 21, the heat of the heated transporting nozzle 4 is transmitted from the tip part of the transporting nozzle 4 to the magnetic head slider 2 that is in contact with the nozzle 4. With this, the magnetic head slider 2 is heated almost to a predetermined temperature. In the meantime, it is possible to prevent the magnetic head slider 2, the trace 13, and the like from being heated to the temperature that may cause damages thereto.

Then, for example, during or after heating the magnetic head slider 2 as described above, the solder ball 3 is sucked and held at the tip part of the soldering laser nozzle 6 and, as in the case of FIG. 1B, the soldering laser nozzle 6 is placed in such a manner that the solder ball 3 comes between the slider-side pad 22 and the suspension-side pad 14 (step S13). The solder ball 3 may be placed between each of the pads 22 and 14 at any timing, but at least before the soldering. For example, it may be placed simultaneously at the time of transporting the magnetic head slider 2.

Thereafter, as shown in FIG. 21, the laser beam L2 is irradiated from the soldering laser nozzle 6 (step S14), and the solder ball 3 is heated (soldering step). At this time, the laser beam L2 is irradiated with the intensity and for a length of time set in advance. As shown in FIG. 16, compared to the energy amount applied in the case of the above-described conventional technique shown in FIG. 6A, only about a half the energy is applied.

The transporting nozzle 4 is in contact with the magnetic head slider 2 and also a sucking force is applied to the magnetic head slider 2 form the nozzle 4, so that a part of the magnetic head slider 2 near the slider-side pad 22 has a high heat radiation rate (see FIG. 2A), thereby exhibiting a low temperature increase rate. However, since the magnetic head slider 2 is indirectly heated by the heat from the above-described heater 8, the temperature of the slider-side pad 22 is also set to be high. Thus, even if the amount of heat applied to the solder ball 3 by the soldering laser nozzle 6 is small, it is possible to achieve highly reliable soldering as in the case of solder 3 shown in FIG. 22. At the same time, as shown with arrows of FIG. 21, excessive heating for the magnetic head slider 2 and the trace 13 can be suppressed. Therefore, such a damage shown with a reference code D in FIG. 5B described in the conventional technique can be prevented. Further, the time for soldering can be shortened.

The embodiments above have been described by referring to the case where the magnetic head slider 2 that is the bonding target is heated through heating the transporting nozzle 4 by the laser beam or the heater. However, the bonding targets such as the magnetic head slider 2 may be heated directly or indirectly by using other heating devices. Further, in the above it has been described by referring to the case of heating only one of the bonding targets, such as the magnetic head slider 2. However, the other bonding target (the suspension side in the above-described embodiments) may also be heated at the same time to a prescribed temperature as well. At this time, different amount of heat may be applied depending on the temperature increase rates of each bonding target.

The apparatus and method of soldering according to the present invention can be used for soldering electronic components, such as when soldering a magnetic head slider to a suspension. In that respect, the present invention has industrial applicability.

What is claimed is:

1. A soldering method, comprising:
providing a plurality of bonding targets and placing each of the plurality of bonding targets at a corresponding bonding position;
each of the plurality of bonding targets being provided with corresponding bonding pads, and placing solder between each of the corresponding bonding pads and soldering by irradiating a heating beam to the solder; and
heating at least one of the bonding targets before and/or simultaneously with the soldering,
the placing of the bonding target comprising providing a transporter that holds the bonding target and transports the bonding target to the corresponding bonding position, and
the heating of the bonding target comprising providing a bonding target heater that heats the bonding target, by heating the transporter, while the bonding target is transported.

2. The soldering method according to claim 1, wherein the heat applied to the solder heats at least one of the bonding targets whose bonding pad has a low temperature increase rate.

3. The soldering method according to claim 2, wherein the heating of the bonding target applies heat in such a manner that a temperature of the bonding target does not exceed a temperature that is set in advance.

4. The soldering method according to claim 1, wherein the heating of the bonding target heats the transporter by providing the bonding target heater in contact with the transporter.

5. The soldering method according to claim 1, wherein the heating of the bonding target heats the transporter by irradiating a heating beam to the transporter.

6. The soldering method according to claim 2, wherein one of the bonding targets heated in the heating of the bonding target is a magnetic head slider, and another one of the bonding targets to which the magnetic head slider is bonded is a suspension that constitutes a head gimbals assembly.

7. A head gimbals assembly manufacturing method for manufacturing a head gimbals assembly through soldering the magnetic head slider to the suspension by the soldering method of claim 6.

8. A soldering apparatus, comprising:
a bonding target placing device that places each of a plurality of bonding targets at a corresponding bonding position;
a soldering heating device that performs soldering by irradiating a heating beam to solder that is placed between corresponding bonding pads formed in each of the plurality of bonding targets;
a bonding target heating device that heats at least one of the bonding targets, the bonding target heating device being different from the solder heating device;

the bonding target placing device comprising the transporter that holds the bonding target and transports the bonding target to the corresponding bonding position, and the bonding target heating device heating the bonding target by heating the transporter before the solder heating device irradiates the heating beam to the solder and/or while the solder heating device is irradiating the heat beam to the solder.

9. The soldering apparatus according to claim 8, wherein the bonding target heating device comprises a control device which controls heating in such a manner that a temperature of the bonding target does not exceed a temperature that is set in advance.

10. The soldering apparatus according to claim 8, wherein the transporter comprises a suction nozzle which sucks and holds the bonding target at its tip part.

11. The soldering apparatus according to claim 8, wherein the bonding target heating device heats the transporter by being placed in contact with the transporter.

12. The soldering apparatus according to claim 8, wherein the bonding target heating device is a heating beam irradiating device used for the bonding target, the bonding target heating device heating the transporter by irradiating the heating beam to the transporter.

13. The soldering apparatus according to claim 8, wherein one of the bonding targets heated by the bonding target heating device is a magnetic head slider, and other one of the bonding target to which the magnetic head slider is bonded is a suspension that constitutes a head gimbals assembly.

* * * * *